United States Patent
Matsuda et al.

(10) Patent No.: US 11,509,244 B2
(45) Date of Patent: Nov. 22, 2022

(54) PIEZOELECTRIC MATERIAL, PIEZOELECTRIC ELEMENT, AND ELECTRONIC EQUIPMENT

(71) Applicants: CANON KABUSHIKI KAISHA, Tokyo (JP); FUJI CHEMICAL CO., LTD., Osaka (JP)

(72) Inventors: Takanori Matsuda, Chofu (JP); Makoto Kubota, Yokohama (JP); Hisato Yabuta, Machida (JP); Miki Ueda, Tokyo (JP); Kanako Oshima, Tokyo (JP); Fumio Uchida, Daito (JP); Hiroki Imai, Nakatsugawa (JP); Kenji Maeda, Hirakata (JP); Chiemi Shimizu, Hirakata (JP)

(73) Assignees: CANON KABUSHIKI KAISHA, Tokyo (JP); FUJI CHEMICAL CO., LTD., Osaka (JP)

( * ) Notice: Subject to any disclaimer, the term of this patent is extended or adjusted under 35 U.S.C. 154(b) by 403 days.

(21) Appl. No.: 16/775,561

(22) Filed: Jan. 29, 2020

(65) Prior Publication Data
US 2020/0169192 A1    May 28, 2020

Related U.S. Application Data

(63) Continuation of application No. PCT/JP2018/028857, filed on Aug. 1, 2018.

(30) Foreign Application Priority Data

Aug. 4, 2017    (JP) .............................. JP2017-151953

(51) Int. Cl.
*H02N 2/10*    (2006.01)
*H04N 5/225*   (2006.01)
(Continued)

(52) U.S. Cl.
CPC .......... *H02N 2/103* (2013.01); *B41J 2/14233* (2013.01); *C04B 35/495* (2013.01);
(Continued)

(58) Field of Classification Search
CPC ........ H02N 2/103; H02N 2/106; H02N 2/163; B41J 2/14233; B41J 2202/03;
(Continued)

(56) References Cited

U.S. PATENT DOCUMENTS

| 8,518,290 B2 | 8/2013 | Watanabe et al. |
| 8,663,493 B2 | 3/2014 | Matsuda et al. |

(Continued)

FOREIGN PATENT DOCUMENTS

| JP | 2009-227535 A | 10/2009 |
| JP | 2015-163576 A | 9/2015 |

(Continued)

OTHER PUBLICATIONS

IP.com search (Year: 2022).*

(Continued)

*Primary Examiner* — Lisa Solomon
(74) *Attorney, Agent, or Firm* — Venable LLP

(57) ABSTRACT

A lead-free piezoelectric material includes perovskite-type metal oxide containing Na, Nb, Ba, Ti, and Mg and indicates excellent piezoelectric properties. The piezoelectric material satisfies the following relational expression (1): $0.430 \leq a \leq 0.460$, $0.433 \leq b \leq 0.479$, $0.040 \leq c \leq 0.070$, $0.0125 \leq d \leq 0.0650$, $0.0015 \leq e \leq 0.0092$, $0.9 \times 3e \leq c-d \leq 1.1 \times 3e$, $a+b+c+d+e=1$, where a, b, c, d, and e denote the relative numbers of Na, Nb, Ba, Ti, and Mg atoms, respectively.

18 Claims, 8 Drawing Sheets

(51) Int. Cl.
*B41J 2/14* (2006.01)
*C04B 35/495* (2006.01)
*C04B 35/626* (2006.01)
*C04B 35/63* (2006.01)
*C04B 35/64* (2006.01)
*H01L 41/047* (2006.01)
*H01L 41/083* (2006.01)
*H01L 41/09* (2006.01)
*H01L 41/187* (2006.01)
*H01L 41/273* (2013.01)

(52) U.S. Cl.
CPC .... *C04B 35/6262* (2013.01); *C04B 35/62695* (2013.01); *C04B 35/6303* (2013.01); *C04B 35/64* (2013.01); *H01L 41/0471* (2013.01); *H01L 41/083* (2013.01); *H01L 41/0973* (2013.01); *H01L 41/1871* (2013.01); *H01L 41/1873* (2013.01); *H01L 41/273* (2013.01); *H04N 5/22521* (2018.08); *C04B 2235/3206* (2013.01); *C04B 2235/3236* (2013.01); *C04B 2235/3255* (2013.01); *C04B 2235/3263* (2013.01); *C04B 2235/604* (2013.01); *C04B 2235/6567* (2013.01); *C04B 2235/768* (2013.01)

(58) Field of Classification Search
CPC ................ B41J 2/14274; C04B 35/495; C04B 35/6262; C04B 35/62695; C04B 35/6303; C04B 35/64; C04B 2235/3206; C04B 2235/3236; C04B 2235/3255; C04B 2235/3263; C04B 2235/604; C04B 2235/6567; C04B 2235/768; C04B 2235/3201; C04B 2235/3215; C04B 35/499; H01L 41/0471; H01L 41/083; H01L 41/0973; H01L 41/1871; H01L 41/1873; H01L 41/273; H01L 41/43; H04N 5/22521

See application file for complete search history.

(56) References Cited

U.S. PATENT DOCUMENTS

| | | | |
|---|---|---|---|
| 9,660,174 | B2 | 5/2017 | Murakami et al. |
| 10,074,796 | B2 | 9/2018 | Ueda et al. |
| 10,103,314 | B2 | 10/2018 | Miura et al. |
| 2014/0125204 | A1 | 5/2014 | Matsuda et al. |
| 2016/0351789 | A1 | 12/2016 | Watanabe et al. |
| 2020/0169190 | A1 | 5/2020 | Oshima et al. |
| 2020/0169191 | A1 | 5/2020 | Kubota et al. |

FOREIGN PATENT DOCUMENTS

| | | | | | |
|---|---|---|---|---|---|
| JP | 2016-98169 | A | | 5/2016 | |
| JP | 2016-197717 | A | | 11/2016 | |
| JP | 2016-197718 | A | | 11/2016 | |
| JP | 2016197717 | A | * | 11/2016 | .......... B41J 2/14274 |
| WO | 2015/115279 | A1 | | 8/2015 | |
| WO | 2016/157854 | A1 | | 10/2016 | |
| WO | 2016/157855 | A1 | | 10/2016 | |
| WO | 2019/026941 | A1 | | 2/2019 | |
| WO | 2019/026960 | A1 | | 2/2019 | |
| WO | 2019/026964 | A1 | | 2/2019 | |

OTHER PUBLICATIONS

International Search Report in International Application No. PCT/JP2018/028857 (dated Oct. 2018).
Saburo Nagakura et al. (ed.), Iwanami Physicochemical Dictionary, 5th Edition, p. 1268-1269 (Iwanami Shoten, Publishers; Feb. 20, 1998).
Informal Comments in International Application No. PCT/JP2018/028857 (Feb. 2019).
International Preliminary Report on Patentability in International Application No. PCT/JP2018/028857 (dated Feb. 2020).
Extended European Search Report in European Application No. 18840240.8 (dated Feb. 2021).
Oshima et al., U.S. Appl. No. 16/775,523, filed Jan. 29, 2020.
Kubota et al., U.S. Appl. No. 16/775,542, filed Jan. 29, 2020.

* cited by examiner

PIEZOELECTRIC MATERIAL, PIEZOELECTRIC ELEMENT, AND ELECTRONIC EQUIPMENT

CROSS-REFERENCE TO RELATED APPLICATIONS

This application is a Continuation of International Patent Application No. PCT/JP2018/028857, filed Aug. 1, 2018, which claims the benefit of Japanese Patent Application No. 2017-151953, filed Aug. 4, 2017, both of which are hereby incorporated by reference herein in their entirety.

BACKGROUND OF THE INVENTION

Field of the Invention

The present invention relates to a piezoelectric material containing substantially no lead and a piezoelectric element using such a piezoelectric material. Additionally, the present invention also relates to electronic equipment using such a piezoelectric element.

Description of the Related Art

Conventionally, perovskite-type metal oxide in $ABO_3$ structure such as lead zirconate titanate containing lead (hereinafter referred to as "PZT") has been known as a typical piezoelectric material. A piezoelectric element including such a piezoelectric material provided with an electrode on a surface has been commonly used in various kinds of piezoelectric devices and electronic equipment such as actuators, oscillators, sensors, and filters.

However, since the PZT contains lead as an A-site element, there is a possibility that the lead components in the disposed piezoelectric material seep into the soil and affect the ecosystem, for example, and the effect on the environment has been regarded as a problem. For this reason, various kinds of piezoelectric materials containing no lead (hereinafter, referred to as "lead-free piezoelectric material") have been considered.

As an example of such a lead-free piezoelectric material, there is a solid solution of sodium niobate ($NaNbO_3$) and barium titanate ($BaTiO_3$) (hereinafter, referred to as "NN-BT"). Since the NN-BT contains substantially no potassium leading to the poor sinterability and the low moisture resistance, the NN-BT has an advantage that the piezoelectric characteristics rarely change over time. Additionally, when the NN-BT is used for a piezoelectric device, a usage temperature range of the device (for example, from 0° C. to 80° C.) does not include a point (temperature) causing the phase transition of the crystal structure, which is advantageous in that significant variation of the performance depending on the usage temperature rarely occurs.

However, since a piezoelectric constant (also referred to as a piezoelectric strain constant) of the NN-BT is smaller than that of the PZT in general, studies have been made for increasing the piezoelectric constant. For example, Japanese Patent Application Laid-Open No. 2009-227535 discloses that addition of cobalt oxide (CoO) to the NN-BT achieves an increase in the piezoelectric constant.

In Japanese Patent Application Laid-Open No. 2009-227535, a piezoelectric constant $d_{31}$ obtained by adding cobalt oxide is 56 pC/N at the maximum (although the unit of $d_{31}$ is pC/m in Japanese Patent Application Laid-Open No. 2009-227535, it seems a misdescription of pC/N); however, the piezoelectric constant is desired to be further increased for application as the piezoelectric element. To address this, the present invention is intended to provide a lead-free type piezoelectric material with a piezoelectric constant further increased. Additionally, the present invention is intended to provide a piezoelectric element using such a piezoelectric material and electronic equipment using such a piezoelectric element.

SUMMARY OF THE INVENTION

In order to solve the above-described problem, the present invention provides a piezoelectric material including: perovskite-type metal oxide containing Na, Nb, Ba, Ti, and Mg, in which relative numbers a, b, c, d, and e in a ratio of numbers of Na, Nb, Ba, Ti, and Mg atoms contained in the piezoelectric material satisfy a following relational expression (1), $$0.430 \le a \le 0.460,\ 0.433 \le b \le 0.479,\ 0.040 \le c \le 0.070,\\ 0.0125 \le d \le 0.0650,\ 0.0015 \le e \le 0.0092,\ 0.9 \times 3e \le c-d \le 1.1 \times 3e,\ a+b+c+d+e=1 \quad (1),$$

where a denotes the relative number of Na atoms, b denotes the relative number of Nb atoms, c denotes the relative number of Ba atoms, d denotes the relative number of Ti atoms, and e denotes the relative number of Mg atoms.

Additionally, the present invention provides a piezoelectric element including: a piezoelectric material portion; and a first electrode and a second electrode that can apply a voltage to the piezoelectric material portion, in which a piezoelectric material constituting the piezoelectric material portion is the above-described piezoelectric material of the present invention. Moreover, the present invention provides electronic equipment including the above-described piezoelectric element of the present invention.

Further features of the present invention will become apparent from the following description of exemplary embodiments with reference to the attached drawings.

DESCRIPTION OF THE EMBODIMENTS

Figure 1:
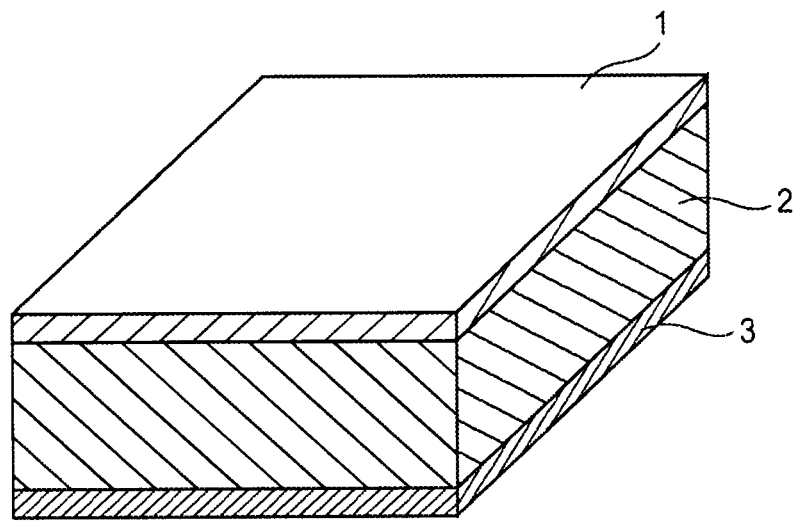
FIG. 1 is a schematic diagram showing a form of a configuration of a piezoelectric element of the present invention.

Embodiments of the present invention are described below.

The present invention provides a lead-free potassium piezoelectric material having excellent piezoelectric properties, which is an NN-BT-type piezoelectric material having a novel composition. It should be noted that the piezoelectric material of the present invention can be used for various applications other than a piezoelectric element, such as a condenser, a memory, and a sensor, by using the properties as a dielectric.

A piezoelectric material of the present invention includes perovskite-type metal oxide containing Na, Nb, Ba, Ti, and Mg, which is a lead-free type piezoelectric material indicating excellent piezoelectric properties. Relative numbers a, b, c, d, and e in a ratio of numbers of Na, Nb, Ba, Ti, and Mg atoms contained in the piezoelectric material satisfy a following relational expression (1), $$0.430 \leq a \leq 0.460, \ 0.433 \leq b \leq 0.479, \ 0.040 \leq c \leq 0.070,$$
$$0.0125 \leq d \leq 0.0650, \ 0.0015 \leq e \leq 0.0092, \ 0.9 \times 3e \leq c - d \leq 1.1 \times 3e, \ a+b+c+d+e=1 \quad (1),$$

where a, b, c, d, and e denote the relative numbers of Na, Nb, Ba, Ti, and Mg atoms, respectively.

Perovskite-type metal oxide in the present invention indicates metal oxide described in the 5th Edition of Iwanami Dictionary of Physics and Chemistry (published by Iwanami Shoten, Feb. 20, 1998), the metal oxide having a perovskite-type structure (also referred to as a perovskite structure) that ideally is a cubic structure. The metal oxide having the perovskite-type structure is expressed by a chemical formula of $ABO_3$, in general. In the perovskite-type metal oxide, atoms of elements A and B each in a form of ion are in specific positions called A-sites and B-sites in a unit cell. For example, in a cubic unit cell, the atoms of the A elements are positioned at vertices of the cube, and the atoms of the B elements are positioned to be body-centered. O elements (oxygen atoms) are positioned to be face-centered as anions of oxygen. The coordinate number of the A-site element is 12, and the coordinate number of the B-site element is six. When the coordinates of the atoms of the A elements, the B elements, and the O elements are slightly shifted from the symmetric positions in the unit cell, the unit cell of the perovskite-type structure is deformed such that the crystal system becomes a tetragonal crystal, a rhombohedral crystal, an orthorhombic crystal, or the like.

In the perovskite-type metal oxide of the present invention, metal elements positioned in the A-sites are Na (the relative number of atoms=a) and Ba (the relative number of atoms=c), and metal elements positioned in the B-sites are Ti (the relative number of atoms=d), Nb (the relative number of atoms=b), and Mg (the relative number of atoms=e).

The piezoelectric material of the present invention can increase a piezoelectric constant by containing Na, Ba, Nb, Ti, and Mg simultaneously as the main component. When the composition of the piezoelectric material of the present invention is analyzed, the top six elements having the highest abundance ratio of the number of atoms are preferably Na, Ba, Nb, Ti, Mg, and O. The above-described piezoelectric material preferably contains 98.0 atom % or more of Na, Ba, Nb, Ti, Mg, and O as a total sum.

The piezoelectric material of the present invention is a piezoelectric material including: perovskite-type metal oxide containing Na, Nb, Ba, Ti, and Mg, in which relative numbers a, b, c, d, and e in a ratio of numbers of Na, Nb, Ba, Ti, and Mg atoms contained in the piezoelectric material satisfy a following relational expression (1), $$0.430 \leq a \leq 0.460, \ 0.433 \leq b \leq 0.479, \ 0.040 \leq c \leq 0.070,$$
$$0.0125 \leq d \leq 0.0650, \ 0.0015 \leq e \leq 0.0092, \ 0.9 \times 3e \leq c - d \leq 1.1 \times 3e, \ a+b+c+d+e=1 \quad (1),$$

where a denotes the relative number of Na atoms, b denotes the relative number of Nb atoms, c denotes the relative number of Ba atoms, d denotes the relative number of Ti atoms, and e denotes the relative number of Mg atoms.

The range of the relative number a of the above-described Na atoms is $0.430 \leq a \leq 0.460$. The a-value of 0.430 or greater makes it possible to obtain a sufficient Curie temperature $T_C$ and to increase the acceptable range of the usage temperature in the case of using the piezoelectric material as a device. The a-value of 0.460 or smaller makes it possible to decrease the sintering temperature for obtaining a sintered body with a sufficient density and to make a different phase other than the perovskite phase that does not contribute the piezoelectric properties less likely to be formed, and the piezoelectric constant $d_{31}$ is increased as a result. A more preferable range of a is $0.440 \leq a \leq 0.450$.

The range of the relative number b of the above-described Nb atoms is $0.433 \leq b \leq 0.479$.

Since the b-value of 0.433 or greater makes it possible to set a temperature $T_{to}$ of a phase transition between the tetragonal crystal phase and the orthorhombic crystal phase, which has an effect of boosting up a relative permittivity $\varepsilon_r$ and an electric machine coupling coefficient $k_{31}$, to be higher than $-100°$ C. and to avoid the phase transition temperature $T_{to}$ from being considerably lower than the room temperature, the relative permittivity $\varepsilon_r$ and the electric machine coupling coefficient $k_{31}$ at the room temperature are increased, and thus the piezoelectric constant $d_{31}$ is increased. Since the b-value of 0.479 or smaller makes it possible to set the temperature $T_{to}$ of the phase transition between the tetragonal crystal phase and the orthorhombic crystal phase to be 120° C. or lower, there is no excessively great temperature difference between the room temperature and the phase transition temperature $T_{to}$ as expected, and the relative permittivity $\varepsilon_r$ and the electric machine coupling coefficient $k_{31}$ at the room temperature are increased, and thus the piezoelectric constant $d_{31}$ is increased. A more preferable range of b is $0.436 \leq b \leq 0.477$.

The range of the relative number c of the above-described Ba atoms is $0.040 \leq c \leq 0.070$. Since the c-value of 0.040 or greater makes it possible to set the temperature $T_{to}$ of the phase transition between the tetragonal crystal phase and the orthorhombic crystal phase to be 100° C. or lower, there is no excessively great temperature difference between the room temperature and the phase transition temperature $T_{to}$, and the relative permittivity $\varepsilon_r$ and the electric machine coupling coefficient $k_{31}$ at the room temperature are increased, and thus the piezoelectric constant $d_{31}$ is increased. Since the c-value of 0.070 or smaller makes it possible to set the temperature $T_{to}$ of the phase transition between the tetragonal crystal phase and the orthorhombic crystal phase to be higher than $-100°$ C., there is no excessively great temperature difference between the room temperature and the phase transition temperature $T_{to}$ as expected, and the relative permittivity $\varepsilon_r$ and the electric machine coupling coefficient $k_{31}$ at the room temperature are increased, and thus the piezoelectric constant $d_{31}$ is increased. A more preferable range of c is $0.050 \leq c \leq 0.060$.

The range of the relative number d of the above-described Ti atoms is $0.0125 \leq d \leq 0.0650$. Since the d-value of 0.0125 or greater makes it possible to decrease the sintering temperature required for obtaining a sufficient sintered body and to suppress the generation of a different phase other than the perovskite phase that does not contribute the piezoelectric properties, the piezoelectric constant $d_{31}$ is increased. The d-value of 0.0650 or smaller makes it possible to increase the Curie temperature $T_C$, and this is preferable because the acceptable range of the usage temperature in the case of using the piezoelectric material as a device is increased. A more preferable range of d is $0.0150 \leq d \leq 0.0600$.

The range of the relative number e of the above-described Mg atoms is $0.0015 \leq e \leq 0.0092$. The e-value of 0.0015 or greater makes it possible to obtain an effect of increasing the piezoelectric constant, which is the characteristic of the present invention. Additionally, the e-value of 0.0092 or smaller makes it possible to grow crystal grains sufficiently and to obtain a great piezoelectric constant. A more preferable range of e is $0.0033 \leq e \leq 0.0084$.

The range of the relative number e of the above-described Mg atoms is $0.0015 \leq e \leq 0.0092$. The e-value of 0.0015 or greater makes it possible to obtain an effect of increasing the piezoelectric constant, which is the characteristic of the present invention. Additionally, the e-value of 0.0092 or smaller makes it possible to grow crystal grains sufficiently and to obtain a great piezoelectric constant. A more preferable range of e is $0.0033 \leq e \leq 0.0084$.

The relative numbers a, b, c, d, and e of the constituent atoms being within the ranges of $0.430 \leq a \leq 0.460$, $0.433 \leq b \leq 0.479$, $0.040 \leq c \leq 0.070$, $0.0125 \leq d \leq 0.0650$, and $0.0015 \leq e \leq 0.0092$ respectively and satisfying the relationships of $0.9 \times 3e \leq c-d \leq 1.1 \times 3e$ and $a+b+c+d+e=1$ simultaneously make it possible to compensate the shortfall c−d of Ti (relative number d) with respect to Ba (relative number c) by using 3e of divalent Mg (relative number e). Thus, in a solid solution of a compound of the metal elements Ba, Mg, and Nb expressed as $BaMg_{1/3}Nb_{2/3}O_3$ and the NN-BT, domains in the particle become finer and the domain density is increased by the $BaMg_{1/3}Nb_{2/3}O_3$ component suppressing the growth of the particle diameter (grain diameter), and accordingly the electric machine coupling coefficient $k_{31}$ and the relative permittivity $\varepsilon_r$ are increased. Consequently, the piezoelectric constant $d_{31}$ as a function of the electric machine coupling coefficient $k_{31}$ and the relative permittivity $\varepsilon_r$ is increased.

Additionally, the above-described relative numbers a, b, and e preferably have a relationship of $0.9 \times 2e \leq b-a \leq 1.1 \times 2e$. Since the shortfall b−a of Na (relative number a) with respect to Nb (relative number b) can be compensated by using 2e of divalent Mg (relative number e), precipitation of a difference phase other than the desired perovskite phase can be reduced. Thus, it is possible to obtain greater piezoelectric constant $d_{31}$.

Moreover, the relative numbers a, b, c, d, and e of the constituent atoms preferably satisfy the relationship of $0.97 \leq (a+c)/(b+d+e) \leq 1.03$. When $(a+c)/(b+d+e)$ is 0.97 or greater, the generation of a different phase other than the desired perovskite phase is suppressed, and when $(a+c)/(b+d+e)$ is 1.03 or smaller, a sufficient sintering density and resistivity are obtained.

The piezoelectric material can also contain Mn in addition to the above-described elements. In this case, the content of Mn is preferably 0.0050 or smaller in the atomic ratio, more preferably 0.0005 or greater and 0.0050 or smaller, and even more preferably 0.0006 or greater and 0.0030 or smaller, when the sum of the numbers of the atoms of Na, Nb, Ba, Ti, and Mg is 1. Mn has an effect of increasing the resistivity of the piezoelectric material and making it possible to apply the voltage completely during the polarization, and this effect is exerted by adding an appropriate amount of Mn. The complete application of the voltage during the polarization makes it possible to sufficiently exert the performance as the piezoelectric element that the piezoelectric material potentially has. This enables, for example, increase of the piezoelectric constant $d_{31}$ and the mechanical quality factor Qm, considerable decrease of a dielectric dissipation factor, and the like.

The electric resistivity of the piezoelectric material at the room temperature is preferably 200 GΩcm or greater ($2 \times 10^{11}$ Ωcm or greater).

The electric resistivity at the room temperature can be calculated based on a leak current value obtained, for example, 20 seconds after application of, for example, a direct-current voltage of 10 V, with an electrode applied to the piezoelectric material.

The dielectric dissipation factor of the piezoelectric material at the room temperature is preferably 0.02 or smaller. The dielectric dissipation factor at the room temperature of 0.02 or smaller makes it possible to suppress the heating of the piezoelectric element in the driving of the piezoelectric element using the piezoelectric material of the present invention to 50° C. or lower, for example. The dielectric dissipation factor at the room temperature is more preferably 0.016 or smaller. The dielectric dissipation factor of the piezoelectric material at the room temperature can be measured at a frequency of 1 kHz, for example, by using a commercially available impedance analyzer with an electrode applied to the piezoelectric material.

The sum of the contents of Pb and K contained in the piezoelectric material of the present invention is preferably less than 1000 atom ppm with respect to the sum of the contents of Na, Nb, Ba, Ti, and Mg.

More preferably, Pb is less than 500 atom ppm, and K is less than 500 atom ppm. Even more preferably, the sum of Pb and K is less than 500 atom ppm.

Suppressing of the amount of Pb contained in the piezoelectric material of the present invention makes it possible to reduce the effect of Pb that is released to the environment when leaving the piezoelectric material in the water or soil.

Additionally, suppressing of the amount of K contained in the piezoelectric material of the present invention makes it possible to improve the moisture resistance and the efficiency during the high-speed vibration of the piezoelectric material.

It is preferable in terms of achieving both the high piezoelectric constant and the processing strength if the grain diameter (average grain diameter) of the crystal grain constituting the piezoelectric material is 1.0 μm or greater and 4.0 μm or smaller. With the average grain diameter set within the above-described range, it is possible to obtain the mechanical strength during cutting processing and polishing processing while securing the sufficient piezoelectric properties. In this specification, the grain diameter means an equivalent circle diameter, and the average grain diameter means an average equivalent circle diameter. The equivalent circle diameter represents a "projected area equivalent circle diameter" used in the microscopy method in general and represents a diameter of an exact circle having the same area as the projected area of the crystal grain.

(Method of Producing Piezoelectric Material)

The piezoelectric material of the present invention has characteristic constituent components, composition ratios, and crystal structure. There is no special limitation in the production method, and the piezoelectric material of the present invention can be obtained by a common method of synthesizing inorganic oxides.

An example of a preferable production method is described below.

In order to obtain piezoelectric ceramics as an aspect of the piezoelectric material of the present invention, it is required to create a compact before firing, first. The ceramics herein indicates a concrete (also referred to as a bulk body) of crystal particles, or a polycrystal, baked by heating processing and containing metal oxide as the main components. A product processed after sintering is also included in the ceramics. Note that, the above-described compact is a solid object made by molding a raw material powder.

When sintering a crystal containing sodium niobate as the component, Na may be evaporated or diffused, and Na in the sample composition after sintering may be insufficient with respect to Nb. Specifically, a defect occurs in the A-sites. However, if an excessive amount of the Na raw material is weighed when weighing the raw material powder, the insulation properties of the sintered body may be reduced. For this reason, it is preferable to compensate the defect by a part of the added Mn positioned in the A-sites. Additionally, the raw material may be weighed intendedly to make Na insufficient by an amount within a range of 5 atom % with respect to Nb.

The raw material powder to be used have preferably a high purity. The metal oxide powders usable as the raw material powder may be Mn compound, Na compound, Nb compound, Ba compound, Ti compound, and Mg compound.

The usable Mn compound may be manganese oxide, manganese acetate, or the like. The usable Na compound may be sodium carbonate, sodium niobate, or the like. The usable Nb compound may be niobium oxide, sodium niobate, barium niobium oxide magnesium oxide, or the like. The usable Ba compound may be barium oxide, barium carbonate, barium oxalate, barium acetate, barium nitrate, barium titanate, barium niobium oxide magnesium oxide, or the like. The usable Ti compound may be titanium oxide, barium titanate, or the like. The usable Mg compound may be magnesium oxide, barium niobium oxide magnesium oxide, or the like.

Additionally, when the Ba compound, the Mg compound, and the Nb compound are mixed and fired in advance and the production is performed by using a raw material powder, which is a powder of $BaMg_{1/3}Nb_{2/3}O_3$ as the main component or a $BaMg_{1/3}Nb_{2/3}O_3$ single phase powder, the particle growth is suppressed, and conventionally, the domains contributing the piezoelectric properties in the particle become finer and have higher density, the electric machine coupling coefficient $k_{31}$ and the relative permittivity $\varepsilon_r$ are increased as a relaxor effect, and the piezoelectric constant $d_{31}$ is further increased.

The molding method may be uniaxial pressing processing, cold isostatic pressing processing, hot isostatic pressing processing, casting molding, and extrusion molding. It is preferable to use a granulation powder when creating the compact. Sintering of the compact using the granulation powder has an advantage that the distribution of sizes of the crystal grains of the sintered body is likely to be even.

Although the method of granulating the raw material powder of the piezoelectric material is not particularly limited, the most preferable granulating method is the spray drying method in terms of making the grain diameter of the granulation powder more even.

An example of a binder usable for the granulating may be polyvinyl alcohol (PVA), polyvinyl butyral (PVB), or acrylic resin. The amount of the binder to be added is preferably 1% by weight to 10% by weight with respect to the raw material powder of the above-described piezoelectric material, and is more preferably 2% by weight to 5% by weight in terms of increasing the density of the compact.

The method of sintering the above-described compact is not particularly limited.

An example of the sintering method may be sintering with an electric furnace, sintering with a gas furnace, an electrically heating method, a microwave sintering method, a milliwave sintering method, hot isotropic pressing (HIP), or the like. The sintering with an electric furnace and gas may use either a continuous furnace or a batch furnace.

Although the sintering temperature in the above-described sintering method is not particularly limited, the sintering temperature is preferably a temperature at which each compound reacts and the crystal grows sufficiently. The sintering temperature is preferably 1050° C. or higher and 1400° C. or lower in terms of setting the grain diameter of the piezoelectric material within 1.0 μm or greater and 4.0 μm or smaller, and is more preferably 1100° C. or higher and 1300° C. or lower. The piezoelectric material sintered at the above-described temperature range has excellent insulation properties and piezoelectric constant. In order to make the properties of the piezoelectric material obtained by the sintering processing stable with the properties reproduced well, it is favorable to perform the sintering processing for one hour or more and 48 hours or less with the sintering temperature set to be constant within the above-described range. Additionally, although it is possible to use a sintering method such as the two-step sintering method, it is preferable to use a method with no rapid temperature change taking into account the productivity.

The density (measured density) of the piezoelectric material can be measured by Archimedes' principle, for example. In the present invention, when the ratio of the measured density ($\rho_{meas}$) to the theoretical density ($\rho_{calc}$) obtained based on the composition and the lattice constant of the piezoelectric material, or the relative density ($\rho_{calc}/\rho_{meas}$), is 92% or greater and 100% or smaller, which is more preferably 92% or greater and 99.9% or smaller, it can be said that the relative density is sufficiently high for the piezoelectric material.

It is preferable to perform the heating processing on the piezoelectric material at a temperature equal to or higher than the Curie temperature after performing the polishing processing on the piezoelectric material obtained by the sintering processing. Although a residual stress is generated inside the piezoelectric material by the mechanical polishing processing, the heating processing at a temperature equal to or higher than the Curie temperature can moderate the residual stress, and the piezoelectric properties of the piezoelectric material are further improved. Although a specific time length of the heating processing is not particularly limited, the heating processing in which a temperature of 300° C. or higher and 500° C. or lower is maintained for one hour or more and 24 hours or less is preferable, for example. Although the present invention is regarding the piezoelectric material, the present invention may be in any form other than ceramics such as a powder, single crystal, film, slurry, or the like.

When the piezoelectric material of the present invention is used as a film formed on a substrate, the thickness of the above-described piezoelectric material is desirably 200 nm or greater and 10 μm or smaller, and is more preferably 300 nm or greater and 3 μm or smaller. This is because it is possible to obtain an electric machine conversion function sufficient for the piezoelectric element by setting the film thickness of the piezoelectric material to 200 nm or greater and 10 μm or smaller.

The method of stacking the above-described films is not particularly limited. For example, the chemical solution deposition method (CSD method), the sol-gel method, the metal organic chemical vapor deposition method (MOCVD method), the sputtering method, the pulsed laser deposition method (PLD method), the hydrothermal synthesis method, the aerosol deposition method (AD method), or the like may be used. Among those, the most preferable stacking method is the chemical solution deposition method or the sputtering method. The chemical solution deposition method or the spattering method can increase the film-forming area easily. The substrate used for the piezoelectric material of the present invention is preferably a single crystal substrate that is cut and polished along the (001) plane, the (110) plane, or the (111) plane. The use of the single crystal substrate that is cut and polished along a specific crystal phase allows strong orientation of the piezoelectric material films provided on the substrate surface in the same orientation.

(Piezoelectric Element)

Next, the piezoelectric element of the present invention is described.

FIG. 1 is a schematic diagram showing a form of a configuration of the piezoelectric element of the present invention. The piezoelectric element of the present invention is a piezoelectric element at least including a first electrode 1, a piezoelectric material portion 2, and a second electrode 3, and a piezoelectric material constituting the above-described piezoelectric material portion 2 is the piezoelectric material of the present invention.

The piezoelectric material according to the present invention can have valuable piezoelectric properties by providing at least the first electrode and the second electrode to the piezoelectric material to form the piezoelectric element. The above-described first electrode and second electrode are each formed of a conductive layer of a thickness of about 5 nm to 10 μm. The material of the conductive layer is not particularly limited and may be anything used for the piezoelectric element in general. For example, the material may be a metal such as Ti, Pt, Ta, Ir, Sr, In, Sn, Au, Al, Fe, Cr, Ni, Pd, Ag, or Cu and a compound thereof.

The above-described first electrode and second electrode may be made of one type of the materials or may be formed by stacking two or more types of the materials. Alternatively, the first electrode and the second electrode may be made of different materials.

The production method of the above-described first electrode and second electrode is not limited, and the first electrode and the second electrode may be formed by plating of metal paste or may be formed by spattering, a deposition method, or the like. Additionally, both the first electrode and second electrode may be formed into desired shapes by patterning to be used.

(Polarization)

It is more preferable that the piezoelectric element of the present invention includes polarization axes arranged in one certain direction. When the polarization axes are arranged in the certain direction, the piezoelectric constant of the above-described piezoelectric element is increased.

The polarization method of the piezoelectric element of the present invention is not particularly limited. The polarization processing may be performed in the atmosphere or may be performed in a silicone oil. Although the temperature during the polarization is preferably a temperature between 60° C. and 170° C., the optimum condition is slightly different depending on the composition of the piezoelectric material constituting the element. An electric field applied for performing the polarization processing is preferably between 800 V/mm and 10.0 kV/mm.

(Resonance-Antiresonance Method)

The piezoelectric constant and the mechanical quality factor of the piezoelectric element of the present invention can be obtained by calculation based on measurement results of resonance frequencies and antiresonance frequencies obtained by using a commercially available impedance analyzer according to the Japan Electronics and Information Technology Industries Association standard (JEITA EM-4501). Hereinafter, this method is referred to as a resonance-antiresonance method.

(Stacked-Type Piezoelectric Element)

Next, a stacked-type piezoelectric element (stacked piezoelectric element) as an embodiment of the piezoelectric element of the present invention is described.

In the piezoelectric element of the present invention, the stacked piezoelectric element of the present invention includes at least one internal electrode in a form of a layer in the piezoelectric material portion and has a stacked structure in which the piezoelectric material in a form of layer formed of the piezoelectric material of the present invention and the at least one internal electrode in a form of layer are stacked alternately.

Figure 2A:
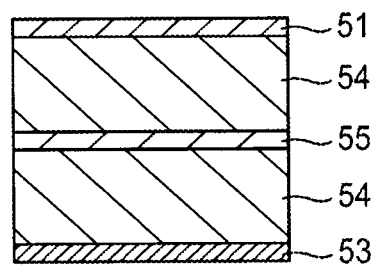
FIG. 2A is a schematic cross-sectional view showing a form of a configuration of a stacked piezoelectric element of the present invention.
Figure 2B:
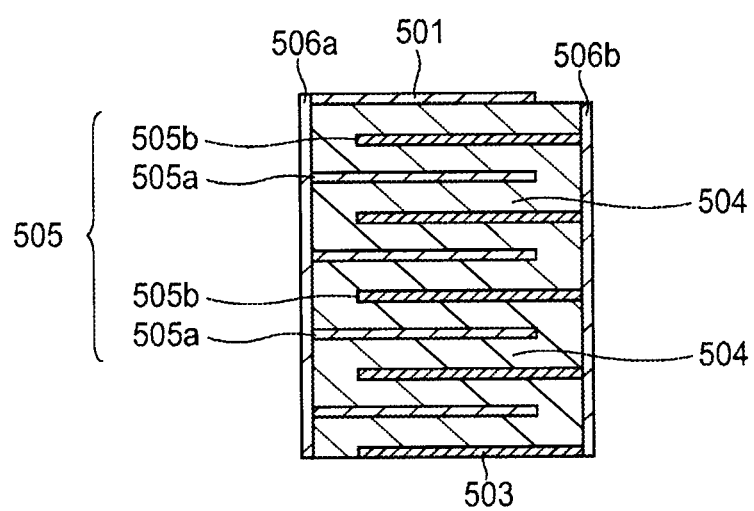
FIG. 2B is a schematic cross-sectional view showing another form of a configuration of the stacked piezoelectric element of the present invention.

FIGS. 2A and 2B are schematic cross-sectional views showing two types of forms of the configuration of the stacked piezoelectric element of the present invention. The stacked piezoelectric elements shown in FIGS. 2A and 2B respectively include piezoelectric material layers 54, 504 and electrode layers including first electrodes 51, 501, second electrodes 53, 503, and internal electrodes 55, 505 (505a and 505b), and the stacked piezoelectric elements shown in FIGS. 2A and 2B are stacked piezoelectric elements in which the above constituents are stacked alternately, with the above-described piezoelectric material layers 54, 504 are formed of the above-described piezoelectric materials. The electrode layers may include external electrodes (506a and 506b in FIG. 2B) and the like in addition to the internal electrodes and the first and second electrodes.

FIG. 2A shows a configuration of the stacked piezoelectric element in which two layers of the piezoelectric material layers 54 and one layer of the internal electrode 55 are stacked alternately, and the stacked structure is arranged between the first electrode 51 and the second electrode 53. The number of the piezoelectric material layers and the internal electrodes may be increased as shown in FIG. 2B, and the number of the layers is not limited. In the stacked piezoelectric element in FIG. 2B, nine layers of the piezoelectric material layers 504 and eight layers of the internal electrodes 505 (505a and 505b) are stacked alternately. The stacked structure has a configuration in which the piezoelectric material layers are arranged between the first electrode 501 and the second electrode 503, and the stacked structure includes the external electrode 506a and the external electrode 506b to short-circuit the internal electrodes formed alternately.

The sizes and the shapes of the internal electrodes 55, 505 (505a and 505b) and the external electrodes 506a and 506b and the first electrodes 51, 501 and the second electrodes 53, 503 are not necessarily the same as that of the piezoelectric material layers 54, 504, and the electrodes may be divided into multiple pieces.

The internal electrodes 55, 505 (505a and 505b), the external electrodes 506a, and 506b, the first electrodes 51, 501, and the second electrodes 53, 503 are each formed of a conductive layer of a thickness of about 5 nm to 10 μm. The material of the conductive layer is not particularly limited and may be anything used for the piezoelectric element in general. For example, the material may be a metal such as Ti, Pt, Ta, Ir, Sr, In, Sn, Au, Al, Fe, Cr, Ni, Pd, Ag, or Cu and a compound thereof. The internal electrodes 55, 505 (505a and 505b) and the external electrodes 506a and 506b may be made of one type of the materials or may be a mixed material or an alloy of two types of the materials, or may be formed by stacking two or more types of the materials. Alternatively, the multiple electrodes may be made of different materials.

The internal electrodes 55, 505 (505a and 505b) contain Ag and Pd, and a weight ratio M1/M2 of a containing weight M1 of the above-described Ag and a containing weight M2 of the above-described Pd is preferably $1.5 \leq M1/M2 \leq 9.0$. If the above-described weight ratio M1/M2 is smaller than 1.5, the heat resistance of the internal electrodes is high but the electrode cost is increased due to the increase of the Pd components, and thus it is undesirable. On the other hand, if the above-described weight ratio M1/M2 is greater than 9.0, the internal electrodes are formed as islands and become uneven in the plane due to the insufficient heat resistance of the internal electrodes, and thus it is undesirable. In terms of the heat resistance and the cost, $2.0 \leq M1/M2 \leq 5.0$ is more preferable.

When the cost of the electrode material is emphasized, the internal electrodes 55, 505 (505a and 505b) preferably include at least one type of Ni and Cu. When at least one type of Ni and Cu is used for the internal electrodes 55, 505, the stacked piezoelectric element of the present invention is preferably sintered under a reducing atmosphere.

As shown in FIG. 2B, the multiple electrodes including the internal electrode 505 (505a and 505b) may be short-circuited with each other in order to coordinate the phases of drive voltages. For example, the internal electrode 505a and the first electrode 501 may be short-circuited by the external electrode 506a. The internal electrode 505b and the second electrode 503 may be short-circuited by the external electrode 506b. In this case, it is preferable that the internal electrode 505a and the internal electrode 505b are arranged alternately. Additionally, the form of the short-circuit between the electrodes is not limited. An electrode and a wiring may be provided for the short-circuit to a side surface of the stacked piezoelectric element, or a through-hole penetrating through the piezoelectric material layer 504 may be provided and a conductive material may be provided inside the through-hole to short-circuit the electrodes with each other.

(Method of Producing Stacked Piezoelectric Element)

A method of producing the stacked-type piezoelectric element according to the present invention is not particularly limited, and the creation method is exemplified below. First, a step (A) in which a powder of a metallic compound containing at least Mn, Na, Nb, Ba, Ti, and Mg is dispersed to obtain a slurry and a step (B) in which a compact is obtained by arranging the above-described slurry on a substrate are executed. Thereafter, a step (C) in which electrodes are formed on the above-described compact and a step (D) in which the compact on which the above-described electrodes are formed is sintered to obtain the stacked piezoelectric element are executed.

(Electronic Equipment)

Electronic equipment according to the present invention is characterized by the above-described piezoelectric element of the present invention (or the stacked piezoelectric element).

Figure 3A:
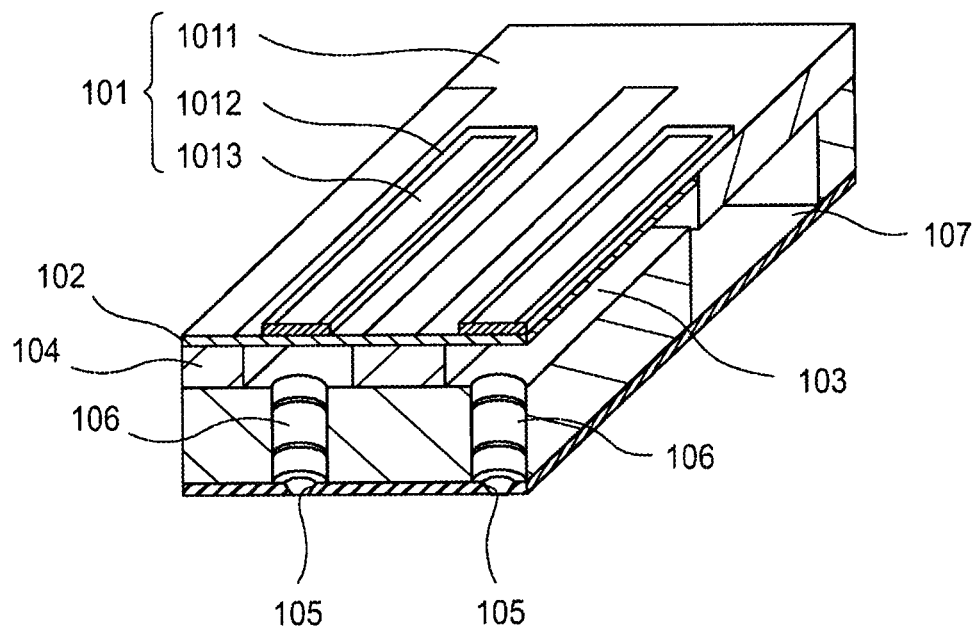
FIG. 3A is a schematic diagram schematically showing a form of a configuration of a liquid ejection unit including the piezoelectric element of the present invention as an example of electronic equipment of the present invention.
Figure 3B:
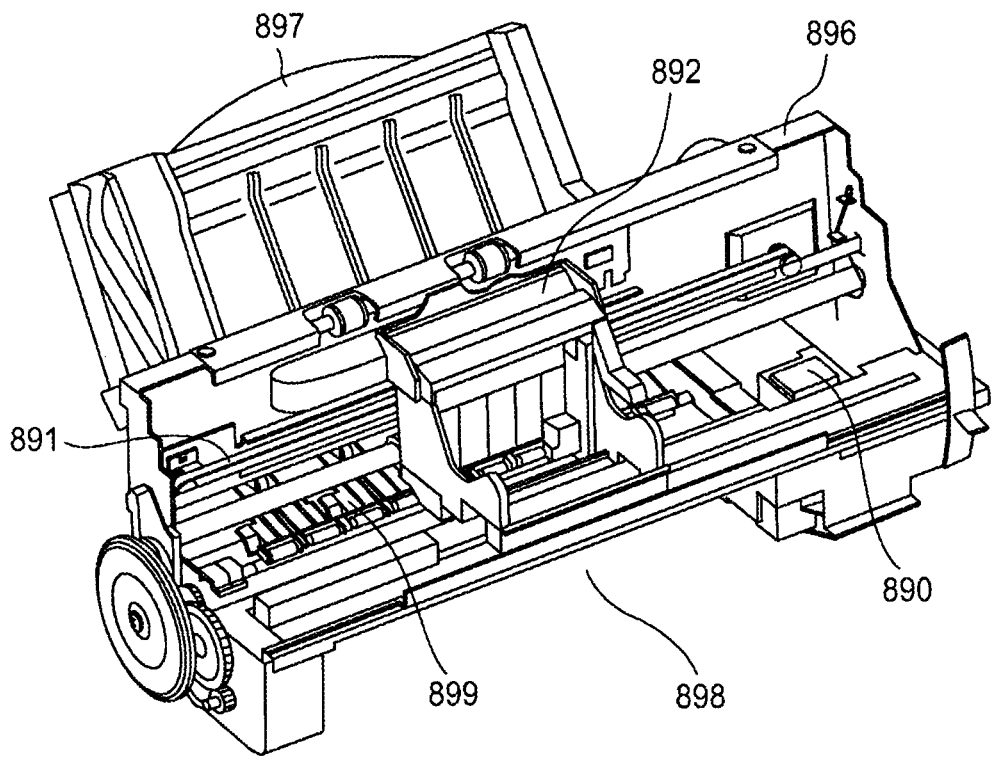
FIG. 3B is a schematic diagram schematically showing a form of a configuration of a liquid ejection apparatus using the liquid ejection head shown in FIG. 3A also as an example of the electronic equipment of the present invention.

Example 1 of Electronic Equipment: Liquid Ejection Head, Liquid Ejection Apparatus FIGS. 3A and 3B are schematic diagrams schematically showing forms of configurations of a liquid ejection head including the piezoelectric element of the present invention and a liquid ejection apparatus using the liquid ejection head as examples of the electronic equipment of the present invention. The liquid ejection head at least includes a liquid chamber including a vibration unit provided with the above-described piezoelectric element or the above-described stacked-type piezoelectric element and an ejection port communicated with the above-described liquid chamber. The liquid ejection apparatus includes a placement portion for a substrate and the above-described liquid ejection head. Note that, the shape and the arrangement of each member are not limited to the examples in FIGS. 3A and 3B.

As shown in FIG. 3A, the liquid ejection head as the electronic equipment of the present invention includes a piezoelectric element 101 of the present invention. The piezoelectric element 101 at least includes a first electrode 1011, a piezoelectric material 1012, and a second electrode 1013. Patterning may be performed on the piezoelectric material 1012 and the second electrode 1013 to improve the ejection performance of the liquid ejection head.

The liquid ejection head includes an ejection port 105, an individual liquid chamber 103, a communication hole 106 connecting the individual liquid chamber 103 and the ejection port 105, a liquid chamber partition wall 104, a common liquid chamber 107, a vibration plate 102, and the piezoelectric element 101. In general, the piezoelectric material 1012 has a shape along the shape of the individual liquid chamber 103.

When the liquid ejection head as an example of the electronic equipment of the present invention is driven by inputting an electric signal thereto, the vibration plate 102 is vibrated up and down along with the deformation of the piezoelectric element 101, and a pressure is applied to a liquid stored in the individual liquid chamber 103. Consequently, the liquid is ejected from the ejection port 105. The liquid ejection head can be used by being mounted in a printer that performs printing on various media and used for producing an electronic device.

Next, the liquid ejection apparatus using the above-described liquid ejection head is described.

This liquid ejection apparatus also can be said as an example of the electronic equipment of the present invention. FIG. 3B exemplifies the liquid ejection apparatus as an inkjet recording device.

In the liquid ejection apparatus in FIG. 3B, mechanisms are incorporated inside an exterior unit 896. An automatic feeding unit 897 has a function of automatically feeding a sheet of recording paper as the object into a device main body. The recording paper fed by the automatic feeding unit 897 is guided to a predetermined recording position (provided with no reference sign) by a conveyance unit 899, and after a recording operation, the recording paper is guided from the recording position to a discharge unit 898 by the conveyance unit 899 again. The conveyance unit 899 is the placement portion for the object. In addition, the above-described liquid ejection apparatus includes a recording unit 891 that performs recoding on the recording paper conveyed to the recording position and a recovering unit 890 that performs recovering processing on the recording unit 891. The recording unit 891 includes a carriage 892 that stores the above-described liquid ejection head and reciprocates the liquid ejection head on a rail.

In such a liquid ejection apparatus, printing is performed according to an instruction from an external computer by transporting the above-described liquid ejection head by the carriage 892 and ejecting ink from the ejection port 105 of the liquid ejection head in response to the voltage application to the piezoelectric element of the present invention.

Although the above-described example is exemplified as a printer, the liquid ejection apparatus of the present invention may be used as a printing device such as a facsimile machine, a multifunction peripheral, and a copier, an industrial liquid ejection apparatus, or a drawing device for a target object. In addition, a user can select a desirable object depending on the intended use.

Example 2 of Electronic Equipment: Oscillatory Wave Motor, Optical Equipment

FIGS. 4A to 4E are schematic diagrams schematically showing configurations of an oscillatory wave motor including the piezoelectric element of the present invention and optical equipment using the oscillatory wave motor as examples of the electronic equipment of the present invention. The oscillatory wave motor at least includes a vibration body provided with the above-described piezoelectric element or the above-described stacked piezoelectric element and a moving body brought into contact with the above-described vibration body. The optical equipment includes the oscillatory wave motor in a drive unit. Note that, the shape and the arrangement of each member are not limited to the examples in FIGS. 4A to 4E.

Figure 4A:
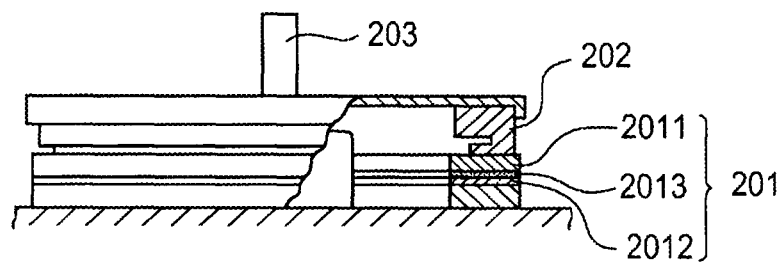
FIG. 4A is a schematic partial cross-sectional view showing a form of an oscillatory wave motor including the piezoelectric element of the present invention as another example of the electronic equipment of the present invention.

The oscillatory wave motor in which the piezoelectric element of the present invention is formed of a single plate is shown in FIG. 4A. The oscillatory wave motor includes a vibration body 201, a moving body 202 (also referred to as a rotor) put in contact with a sliding surface of the vibration body 201 by a pressurizing force of a not-illustrated pressurizing spring, and an output shaft 203 integrally provided with the moving body 202. The above-described vibration body 201 includes a metallic elastic body ring 2011, a piezoelectric element 2012 of the present invention, an organic type adhesive 2013 (epoxy type, cyanoacrylate type, or the like) bonding the piezoelectric element 2012 to the elastic body ring 2011.

When an alternating-current voltage having two phases that are different from each other by an odd multiple of $\pi/2$ is applied to the piezoelectric element, a flexural travelling wave is generated in the vibration body 201, and each point on the sliding surface of the vibration body 201 is moved in an elliptical motion. The rotor 202 receives friction force from the vibration body 201 and is rotated in the opposite direction of the rotation direction of the flexural travelling wave. A not-illustrated driven body is joined with the output shaft 203 and is driven by rotational force of the rotor 202.

Figure 4B:
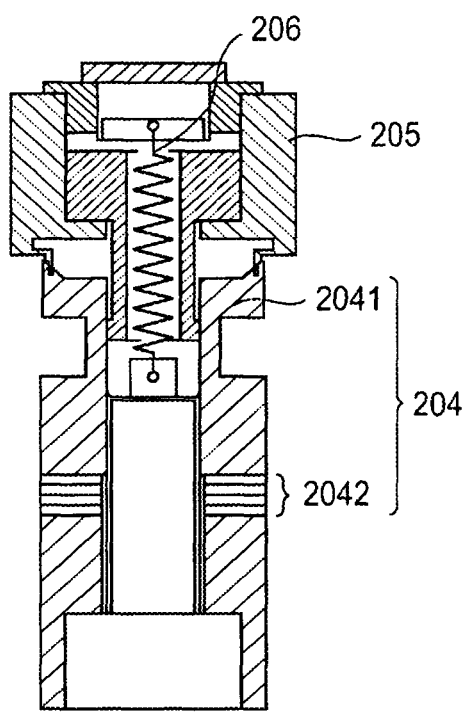
FIG. 4B is a schematic cross-sectional view showing another form of the oscillatory wave motor including the piezoelectric element of the present invention in a similar way as the one in FIG. 4A also as another example of the electronic equipment of the present invention.

Next, an oscillatory wave motor including the piezoelectric element of the present invention (stacked piezoelectric element) having the stacked structure is exemplified in FIG. 4B. A vibration body 204 includes a stacked piezoelectric element 2042 arranged between tubular metallic elastic bodies 2041. The stacked piezoelectric element 2042 is the above-described stacked-type element and includes a first electrode and a second electrode on an outer surface of the stack and includes an internal electrode on an inner surface of the stack. The metallic elastic bodies 2041 sandwich and fix the stacked piezoelectric element 2042 with bolts and form the vibration body 204.

The vibration body 204 excites two vibrations orthogonal to each other by applying the alternating-current voltages having different phases to the stacked piezoelectric element 2042. The two vibrations are synthesized to form a circular vibration for driving a tip end portion of the vibration body 204. Note that, a constricted peripheral groove is formed on an upper portion of the vibration body 204, which increases the displacement of the vibration for the driving.

A moving body 205 (also referred to as a rotor) is pressurized to be brought into contact with the vibration body 204 by a spring 206 for pressurizing and obtains friction force for the driving. The moving body 205 is rotatably supported by a bearing.

Next, the optical equipment using the above-described oscillatory wave motor is described.

Figure 4C:
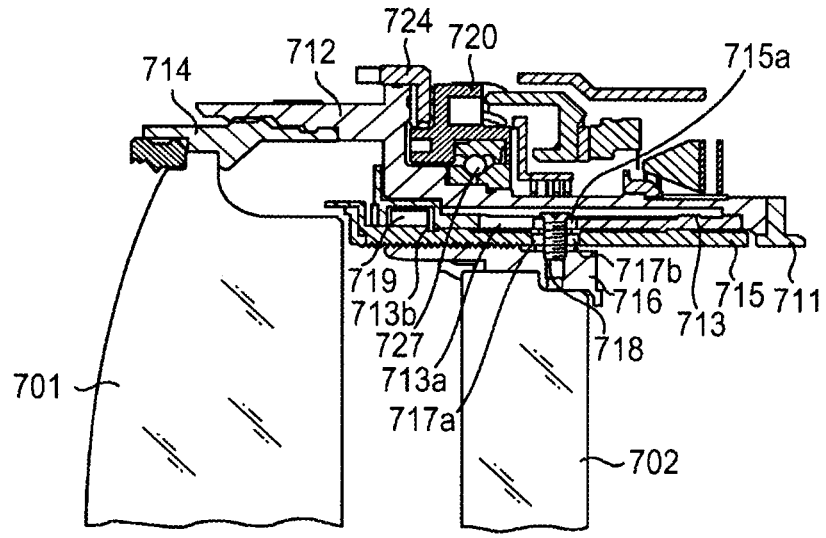
FIG. 4C is a schematic cross-sectional view schematically showing a main part of a configuration of a replacement lens barrel of a single-lens reflex camera, which is a form of an optical equipment using the oscillatory wave motor including the piezoelectric element of the present invention as further another example of the electronic equipment of the present invention.
Figure 4D:
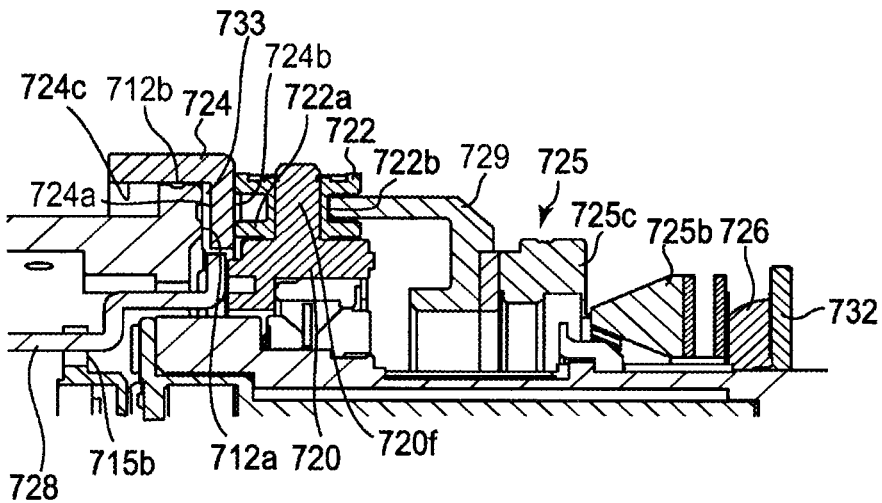
FIG. 4D is an enlarged cross-sectional view showing a part of the configuration shown in FIG. 4C more in detail.
Figure 4E:
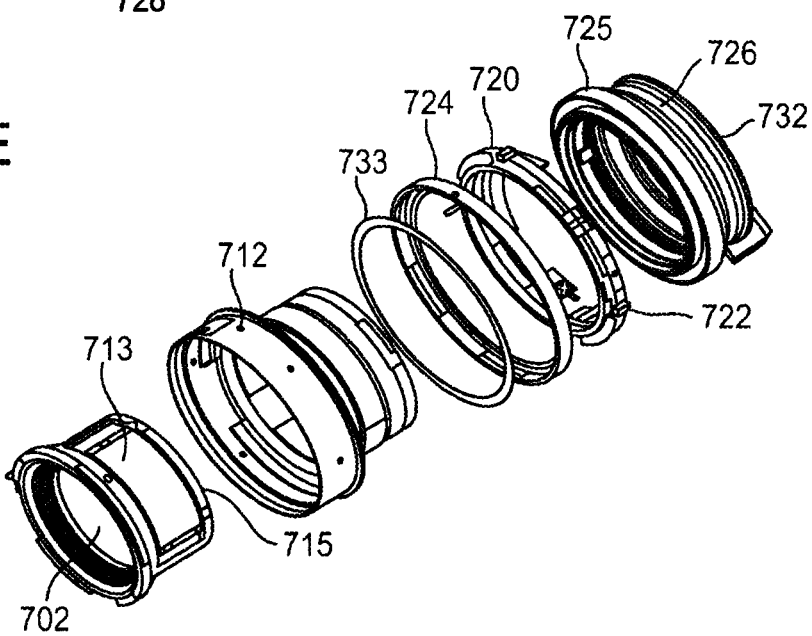
FIG. 4E is a perspective exploded view showing a schematic entire configuration of the replacement lens barrel including the main part shown in FIG. 4C.

This optical equipment also can be said as an example of the electronic equipment of the present invention. FIGS. 4C to 4E exemplify the optical equipment as a replacement lens barrel of a single-lens reflex camera.

FIG. 4C is a cross-sectional view showing the main portion of a configuration of the replacement lens barrel, FIG. 4D is an enlarged cross-sectional view showing a part of the configuration shown in FIG. 4C (a configuration of an outer peripheral side of a fixing tube) more in detail, and FIG. 4E is a perspective exploded view showing a schematic entire configuration of the replacement lens barrel.

A fixing tube 712, a straight guide tube 713, and a front unit lens barrel 714 holding a front unit lens 701 are fixed on a removable mount 711 that is removable from a camera. These are fixing members of the replacement lens barrel.

In the straight guide tube 713, a straight guide groove 713a in the optical axis direction for a focusing lens 702 is formed. Cam rollers 717a and 717b projecting radially outward are fixed with a shaft bis 718 to a rear unit lens barrel 716 holding the focusing lens 702, and this cam roller 717a is fitted to this straight guide groove 713a.

A cam ring 715 is rotatably fitted to an inner periphery of the straight guide tube 713. The relative movement in the optical axis direction of the straight guide tube 713 and the cam ring 715 is restricted with a roller 719 fixed to the cam ring 715 fitted to a peripheral groove 713b of the straight guide tube 713. A cam groove 715a for the focusing lens 702 is formed on this cam ring 715, and the above-described cam roller 717b is also fitted to the cam groove 715a.

A rotation transmission ring 720 rotatably held in a certain position on the fixing tube 712 by a ball race 727 is arranged on an outer peripheral side of the fixing tube 712. In the rotation transmission ring 720, rollers 722 are rotatably held by a shaft 720f extending radially from the rotation transmission ring 720, and a large diameter portion 722a of each roller 722 is put in contact with a mount-side end surface 724b of a manual focusing ring 724. Additionally, a small diameter portion 722b of the roller 722 is put in contact with a joint member 729. Six rollers 722 are arranged at regular intervals on the outer periphery of the rotation transmission ring 720, and each roller is configured to have the above-described relationship.

A low friction sheet (washer member) 733 is arranged in an inner diameter portion of the manual focusing ring 724, and this low friction sheet is arranged between a mount-side end surface 712a of the fixing tube 712 and the front-side end surface 724a of the manual focusing ring 724. Additionally, an outer diameter surface of the low friction sheet 733 is in a ring shape and is fitted to an inner diameter 724c of the manual focusing ring 724, and, furthermore, the inner diameter 724c of the manual focusing ring 724 is fitted to an outer diameter portion 712b of the fixing tube 712. The low friction sheet 733 plays a role for reducing the friction in a rotation ring mechanism in a configuration of relative rotation about the optical axis of the manual focusing ring 724 with respect to the fixing tube 712.

Note that, the large diameter portion 722a of the roller 722 and the mount-side end surface 724b of the manual focusing ring are put in contact with each other with pressurizing force applied by the force of pressing the oscillatory wave motor 725 by a wave washer 726 toward the front side of the lens. Additionally, similarly, the small diameter portion 722b of the roller 722 and the joint member 729 are put in contact with each other with appropriate pressurizing force applied by the force of pressing the oscillatory wave motor 725 by the wave washer 726 toward the front side of the lens. The movement in the mount direction of the wave washer 726 is restricted by the washer 732 coupled to the fixing tube 712 by a bayonet mount. The spring force (biasing force) generated by the wave washer 726 is transmitted to the oscillatory wave motor 725 and subsequently to the roller 722, and also becomes the force pressing the manual focusing ring 724 on the mount-side end surface 712a of the fixing tube 712. That is, the manual focusing ring 724 is incorporated while being pressed on the mount-side end surface 712a of the fixing tube 712 with the low friction sheet 733 arranged therebetween.

Consequently, when the rotor 725c of the oscillatory wave motor 725 is rotated and driven by a not-illustrated control unit with respect to a stator 725b fixed to the fixing tube 712, the roller 722 is rotated about the shaft 720f since the joint member 729 is in friction contact with the small diameter portion 722b of the roller 722. When the roller 722 is rotated about the shaft 720f, the rotation transmission ring 720 is rotated about the optical axis consequently.

Two focusing keys 728 are attached in opposing positions on the rotation transmission ring 720, and the focusing keys 728 are fitted to notch portions 715b provided on a tip end of the cam ring 715. Consequently, when the rotation transmission ring 720 is rotated about the optical axis, the rotational force is transmitted to the cam ring 715 through the focusing keys 728. When the cam ring is rotated about the optical axis, the rear unit lens barrel 716 that the rotation thereof is restricted by the cam roller 717a and the straight guide groove 713a is moved forward and backward along the cam groove 715a of the cam ring 715 by the cam roller 717b. The focusing lens 702 is thus driven, and a focusing operation is performed.

Although the above example of a replacement lens barrel of a single-lens reflex camera is described as the optical equipment using the above-described oscillatory wave motor, the above-described oscillatory wave motor can be applied to an optical equipment provided with a drive unit including an oscillatory wave motor in regardless of a type of a camera, such as a compact camera, an electronic still camera, and the like.

Example 3 of Electronic Equipment: Vibration Device, Image Pickup Apparatus

Figure 5A:
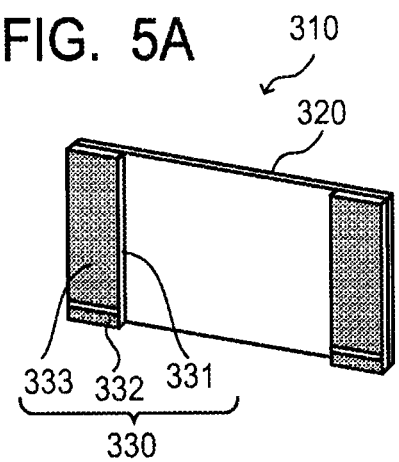
FIG. 5A is a schematic diagram showing a form of a configuration of a vibration device including the piezoelectric element of the present invention as a further another example of the electronic equipment of the present invention.
Figure 5B:
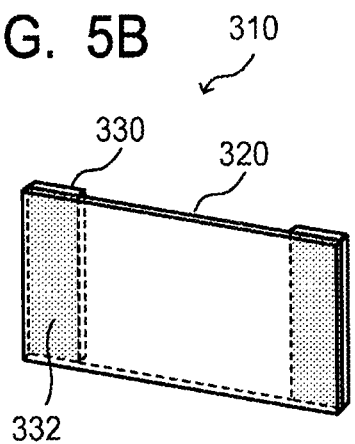
FIG. 5B is a schematic diagram showing a form of the vibration device shown in FIG. 5A viewed from the opposite side.
Figure 5C:
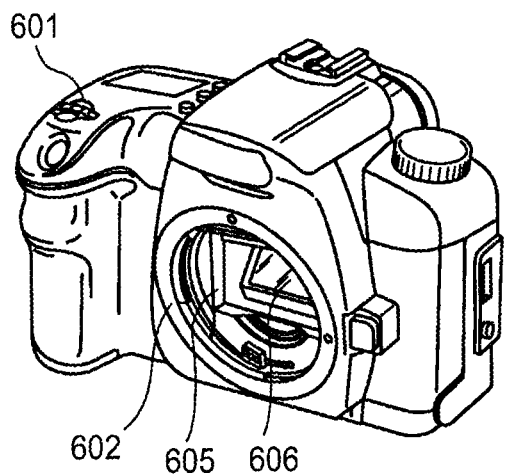
FIG. 5C is a schematic diagram showing a camera main body of a digital single-lens reflex camera as a form of an image pickup apparatus using the vibration device shown in FIGS. 5A and 5B also as a further another example of the electronic equipment of the present invention.
Figure 5D:
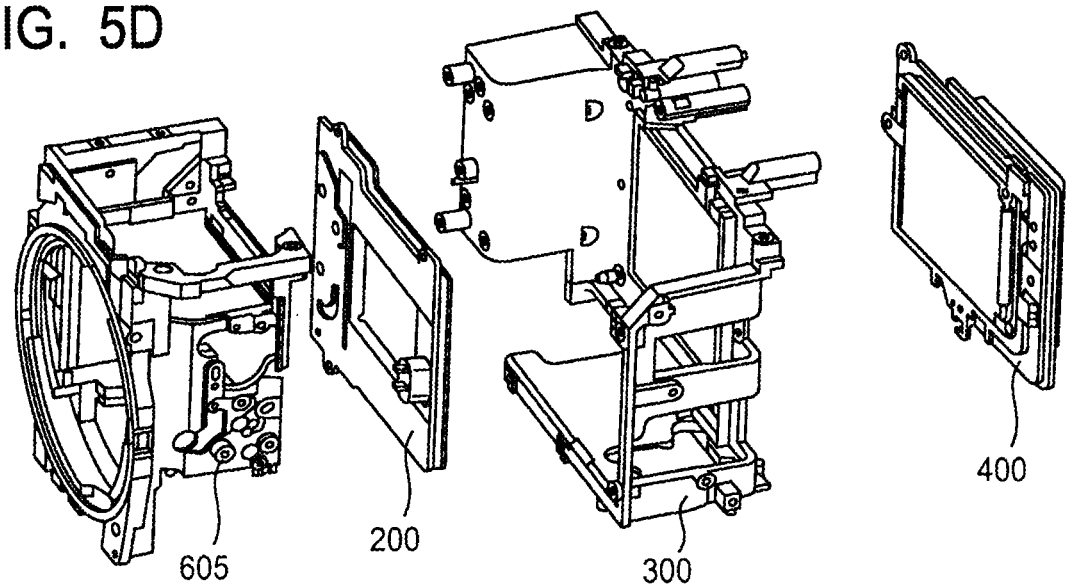
FIG. 5D is a perspective exploded view showing a schematic configuration of inside of the camera main body shown in FIG. 5C.

FIGS. 5A to 5D are schematic diagrams schematically showing a vibration device including the piezoelectric element of the present invention and an image pickup apparatus using the vibration device as examples of the electronic equipment of the present invention. The vibration device shown in FIGS. 5A and 5B is a dust removing apparatus that at least includes a vibration body in which the piezoelectric element of the present invention is arranged on a vibration plate and has a function of removing dust attached on a surface of the vibration plate. The image pickup apparatus shown in FIGS. 5C and 5D is an image pickup apparatus at least including the above-described dust removing apparatus and an image pickup element unit, and the vibration plate of the above-described dust removing apparatus is provided on a light receiving surface side of the above-described image pickup element unit.

Note that, the shape and the arrangement of each member are not limited to the example in FIGS. 5A to 5D. FIGS. 5A and 5B are schematic diagrams showing an embodiment of the electronic equipment as the dust removing apparatus. A dust removing apparatus 310 includes a plate-shaped piezoelectric element 330 and a vibration plate 320. FIG. 5A is a diagram of the dust removing apparatus 310 viewed from a side on which the piezoelectric element 330 is provided, and FIG. 5B is a diagram viewed from the opposite side of FIG. 5A. The piezoelectric element 330 may be the stacked-type piezoelectric element of the present invention. Although the material of the vibration plate 320 is not limited, a translucent material and a light reflection material may be used as the vibration plate 320 when the dust removing apparatus 310 is used in an optical device, and a translucent portion and a light reflection portion of the vibration plate are the target of the dust removal.

The piezoelectric element 330 includes a piezoelectric material 331, a first electrode 332, and a second electrode 333, and the first electrode 332 and the second electrode 333 are arranged on a plate surface of the piezoelectric material 331 to face each other. In the case of the stacked-type piezoelectric element, the piezoelectric material 331 has a configuration in which the piezoelectric material layers and internal electrodes are arranged alternately, and thus the piezoelectric material 331 can give drive waveforms of different phases to each layer of the piezoelectric material by short-circuiting the internal electrodes with the first electrode 332 or the second electrode 333 alternately. FIG. 5A shows the situation where the first electrode 332 comes around to the side of the second electrode 333.

When the alternating-current voltage is applied from the outside to the piezoelectric element 330, stress is generated between the piezoelectric element 330 and the vibration plate 320, and out-of-plane vibration is generated on the vibration plate. The dust removing apparatus 310 is a device for removing a foreign substance such as dust attached on a surface of the vibration plate 320 by the out-of-plane vibration of this vibration plate 320. The out-of-plane vibration is elastic vibration that displaces the vibration plate in the optical axis direction, that is, the thickness direction of the vibration plate.

Next, an image pickup apparatus using the above-described dust removing apparatus is described. This image pickup apparatus also can be said as an example of the electronic equipment of the present invention. FIGS. 5C and 5D exemplify an image pickup apparatus as a digital single-lens reflex camera.

FIG. 5C is a front side perspective view of a camera main body 601 viewed from the object side with a capturing lens unit detached. FIG. 5D is a perspective exploded view showing a schematic configuration of inside of the camera for describing peripheral configurations of the dust removing apparatus and an image pickup unit 400.

In the camera main body 601 shown in FIG. 5C, a mirror box 605 to which capturing luminous flux that passed through the capturing lens is guided is provided, and a main mirror (quick return mirror) 606 is arranged in the mirror box 605. The main mirror 606 can be in the state where the main mirror 606 is held at the angle of 45° to the capturing optical axis for guiding the capturing luminous flux to a direction toward a pentadaha mirror (not illustrated) and can be in the state where the main mirror 606 is held in a position where the main mirror 606 is retracted from the capturing luminous flux for guiding the capturing luminous flux to a direction toward an image pickup element (not illustrated).

In FIG. 5D, on the object side of a main body chassis 300 as a framework of the camera main body, the mirror box 605 and a shutter unit 200 are arranged in this order from the object side. Additionally, the image pickup unit 400 is arranged on the operator side of the main body chassis 300. The above-described image pickup unit 400 includes the vibration plate of the dust removing apparatus and an image pickup element unit. Note that, the vibration plate of the dust removing apparatus is provided to be aligned with a light receiving surface of the above-described image pickup element unit. The image pickup unit 400 is disposed on an attachment surface of a mount portion 602 (FIG. 5C) as a reference for attaching the capturing lens unit and is adjusted such that an image pickup surface of the image pickup element unit has a predetermined distance from the image pickup lens unit and is parallel to the image pickup lens unit.

Although a digital single-lens reflex camera is described herein as an example of the image pickup apparatus, a capturing lens unit replaceable camera such as a mirrorless type digital single-lens camera that is not provided with the mirror box 605 may be applied, for example. Alternatively, among various image pickup apparatuses such as a capturing lens unit replaceable video camera, a copier, a facsimile machine, and a scanner, or among electronic and electric equipment including the image pickup apparatus, an example of the image pickup apparatus may be particularly equipment required to remove dust attached on a surface of an optical part.

Although the liquid ejection head, the liquid ejection apparatus, the oscillatory wave motor, the optical equipment, the vibration device, and the image pickup apparatus are described above as an example of the electronic equipment of the present invention, the type of the electronic equipment is not limited thereto. The piezoelectric element of the present invention is applicable to electronic equipment in general including electronic equipment that takes out electric power from the piezoelectric element to detect an electric signal due to the positive piezoelectric effect and take out energy, and electronic equipment that inputs electric power to the piezoelectric element to use the displacement due to the inverse piezoelectric effect. For example, the electronic equipment of the present invention includes also piezoelectric audio parts and sound reproduction equipment, sound recording equipment, a cellphone, an information terminal, and the like including the piezoelectric audio parts.

Although the piezoelectric material, the piezoelectric element, and the electronic equipment of the present invention are described below more in detail with examples, the present invention is not limited to the following examples.

A. Production of Piezoelectric Material and Creation of Piezoelectric Element

Example 1

Piezoelectric ceramics containing Na, Ba, Nb, Ti, and Mg and further containing Mn was produced.

As the raw material, powders of sodium niobate ($NaNbO_3$, purity of 99.5% or more), barium titanate ($BaTiO_3$, purity of 99.8% or more), barium carbonate ($BaCO_3$, purity of 99.9% or more), magnesium oxide (MgO, purity of 99.9%), niobium oxide ($Nb_2O_5$, purity of 99.9%), and manganic oxide ($Mn_3O_4$, purity of 99.9%, calculated with $MnO_{4/3}$ as a molar quantity) were used.

As a preparation composition, the raw materials were weighed and mixed to obtain the ratios of 0.880 moles of sodium niobate, 0.080 moles of barium titanate, 0.040 moles of barium carbonate, 0.013 moles of magnesium oxide, and 0.013 moles of niobium oxide. The mixed powder was calcined in the air at 1000° C. to 1100° C. for five hours. The calcined powder was crushed, and granulation was performed by adding manganic oxide such that the atom number of Mn becomes 0.0010 when the sum of the numbers of the atoms of Na, Nb, Ba, Ti, and Mg is 1 and by also adding a binder. A mold was filled with the granulated powder, the granulated powder was compressed, and thus a compact was created. The obtained compact was sintered in the air at the maximum temperature of 1250° C. for eight hours, and thus a sintered body was obtained.

It could be confirmed by the X-ray diffraction that the sample had a single phase of substantially the perovskite structure. As a result of evaluating the composition of the sintered body by the inductively coupled plasma atomic emission spectroscopy (ICP), it was found that the sum of the atom numbers of Na, Ba, Nb, Ti, Mg, Mn, and O was 99.8% or more of the component atoms, and all the atoms of Na, Ba, Nb, Ti, and Mg were contained in the sintered body at substantially the same ratio as that of the target composition (a=0.440, b=0.453, c=0.060, d=0.040, e=0.0067). Note that, Pb contained in the sintered body was less than 100 ppm, and K contained therein was less than 200 ppm.

A surface of the sintered body was observed by an optical microscope to evaluate the grain diameter, and it was found that the average grain diameter was 2.8 μm. Note that, a polarizing microscope was mainly used for observing the crystal grain, and a scanning electron microscope (SEM) was used for identifying the grain diameter of a small crystal grain. The equivalent circle diameter of each crystal grain was calculated based on the observation results, and the average (that is, the average equivalent circle diameter) of the crystal gains was set as the average grain diameter.

The density of the piezoelectric ceramics obtained by the Archimedes' principle was 97% or more of the theoretical density. Note that, in general, when the density obtained by the Archimedes' principle is 95% or more of the theoretical density, it can be determined that the crystallization is proceeding sufficiently.

Next, the piezoelectric element was created by using the piezoelectric ceramics produced above.

First, the sintered disk-shaped piezoelectric ceramics was polished to have a thickness of about 0.5 mm. Then, in order to remove the stress inside the piezoelectric ceramics due to this polishing processing and the organic components on the piezoelectric ceramics, heating processing was performed in the air atmosphere at 400° C. for 30 minutes. A gold (Au) electrode having a thickness of 400 nm was formed by the DC spattering method on both the front and back sides of the piezoelectric ceramics after the heat processing. Note that, titanium (Ti) having a thickness of 30 nm as an attachment layer was formed between the electrode and the piezoelectric ceramics.

This piezoelectric ceramics including the electrode was cut into a rectangular plate shape of 10 mm length×2.5 mm width×0.5 mm thickness, which is favorable for the property evaluation, and thus the piezoelectric element was obtained. Note that, the mechanical strength of the piezoelectric ceramics was sufficiently high to perform the polishing processing and the cutting processing with no problem.

The resistivity of the piezoelectric element during the application of 10 V was 270 GΩcm. In general, it is said that the voltage during the polarization processing is applied sufficiently and the piezoelectric properties are exerted efficiently when the resistivity is 200 GΩcm or greater.

Examples 2 to 22, Comparative Examples 1 to 25

The piezoelectric ceramics was produced and the piezoelectric element was created similarly to the example 1 except that the raw material powders were weighed and mixed to achieve the target composition shown in Table 1.

In a comparative example 16 where a value of b−a obtained by subtracting the relative number a of Na atoms from the relative number b of Nb atoms was 2.2 times greater than the relative number e of Mg atoms, precipitation of a different phase other than the perovskite phase was found by the evaluation by the X-ray diffraction. Additionally, the similar precipitation of a different phase was found in a comparative example 25 where the value of b−a was 1.8 times smaller than the relative number e of Mg atoms.

TABLE 1

| | a (=Na) | b (=Nb) | c (=Ba) | d (=Ti) | e (=Mg) | Mn | (c − d)/3e | (b − a)/2e |
|---|---|---|---|---|---|---|---|---|
| Example 1 | 0.440 | 0.453 | 0.060 | 0.040 | 0.0067 | 0.0010 | 1.0 | 1.00 |
| Example 2 | 0.440 | 0.447 | 0.060 | 0.050 | 0.0033 | 0.0010 | 1.0 | 1.00 |
| Example 3 | 0.448 | 0.458 | 0.053 | 0.038 | 0.0050 | 0.0010 | 1.0 | 1.00 |
| Example 4 | 0.448 | 0.461 | 0.053 | 0.033 | 0.0067 | 0.0010 | 1.0 | 1.00 |
| Example 5 | 0.445 | 0.455 | 0.055 | 0.040 | 0.0050 | 0.0015 | 1.0 | 1.00 |
| Example 6 | 0.443 | 0.453 | 0.058 | 0.043 | 0.0050 | 0.0030 | 1.0 | 1.00 |
| Example 7 | 0.450 | 0.453 | 0.050 | 0.045 | 0.0017 | 0.0008 | 1.0 | 1.00 |
| Example 8 | 0.450 | 0.457 | 0.050 | 0.040 | 0.0033 | 0.0006 | 1.0 | 1.00 |
| Example 9 | 0.450 | 0.463 | 0.050 | 0.030 | 0.0067 | 0.0005 | 1.0 | 1.00 |
| Example 10 | 0.450 | 0.467 | 0.050 | 0.025 | 0.0083 | 0.0008 | 1.0 | 1.00 |
| Example 11 | 0.460 | 0.463 | 0.040 | 0.035 | 0.0017 | 0.0010 | 1.0 | 1.00 |
| Example 12 | 0.460 | 0.470 | 0.040 | 0.025 | 0.0050 | 0.0015 | 1.0 | 1.00 |
| Example 13 | 0.460 | 0.477 | 0.040 | 0.015 | 0.0083 | 0.0030 | 1.0 | 1.00 |
| Example 14 | 0.440 | 0.443 | 0.060 | 0.055 | 0.0017 | 0.0015 | 1.0 | 1.00 |
| Example 15 | 0.440 | 0.457 | 0.060 | 0.035 | 0.0083 | 0.0040 | 1.0 | 1.00 |
| Example 16 | 0.430 | 0.433 | 0.070 | 0.065 | 0.0017 | 0.0050 | 1.0 | 1.00 |
| Example 17 | 0.430 | 0.437 | 0.070 | 0.060 | 0.0033 | 0.0040 | 1.0 | 1.00 |
| Example 18 | 0.430 | 0.443 | 0.070 | 0.050 | 0.0067 | 0.0015 | 1.0 | 1.00 |
| Example 19 | 0.430 | 0.447 | 0.070 | 0.045 | 0.0083 | 0.0010 | 1.0 | 1.00 |
| Example 20 | 0.445 | 0.463 | 0.055 | 0.028 | 0.0092 | 0.0010 | 1.0 | 1.00 |
| Example 21 | 0.460 | 0.478 | 0.040 | 0.013 | 0.0092 | 0.0010 | 1.0 | 1.00 |
| Example 22 | 0.430 | 0.448 | 0.070 | 0.043 | 0.0092 | 0.0010 | 1.0 | 1.00 |
| Comparative example 1 | 0.430 | 0.450 | 0.070 | 0.040 | 0.0100 | 0.0020 | 1.0 | 1.00 |
| Comparative example 2 | 0.440 | 0.460 | 0.060 | 0.030 | 0.0100 | 0.0030 | 1.0 | 1.00 |
| Comparative example 3 | 0.450 | 0.470 | 0.050 | 0.020 | 0.0100 | 0.0015 | 1.0 | 1.00 |
| Comparative example 4 | 0.460 | 0.480 | 0.040 | 0.010 | 0.0100 | 0.0050 | 1.0 | 1.00 |
| Comparative example 5 | 0.465 | 0.475 | 0.035 | 0.020 | 0.0050 | 0.0040 | 1.0 | 1.00 |
| Comparative example 6 | 0.465 | 0.468 | 0.035 | 0.030 | 0.0017 | 0.0010 | 1.0 | 1.00 |
| Comparative example 7 | 0.460 | 0.460 | 0.040 | 0.040 | 0.0000 | 0.0015 | — | — |

TABLE 1-continued

|  | a (=Na) | b (=Nb) | c (=Ba) | d (=Ti) | e (=Mg) | Mn | (c − d)/3e | (b − a)/2e |
|---|---|---|---|---|---|---|---|---|
| Comparative example 8 | 0.445 | 0.445 | 0.055 | 0.055 | 0.0000 | 0.0030 | — | — |
| Comparative example 9 | 0.440 | 0.440 | 0.060 | 0.060 | 0.0000 | 0.0005 | — | — |
| Comparative example 10 | 0.430 | 0.430 | 0.070 | 0.070 | 0.0000 | 0.0010 | — | — |
| Comparative example 11 | 0.425 | 0.428 | 0.075 | 0.070 | 0.0017 | 0.0030 | 1.0 | 1.00 |
| Comparative example 12 | 0.425 | 0.435 | 0.075 | 0.060 | 0.0050 | 0.0015 | 1.0 | 1.00 |
| Comparative example 13 | 0.425 | 0.442 | 0.075 | 0.050 | 0.0083 | 0.0010 | 1.0 | 1.00 |
| Comparative example 14 | 0.440 | 0.460 | 0.060 | 0.030 | 0.0100 | 0.0004 | 1.0 | 1.00 |
| Comparative example 15 | 0.440 | 0.460 | 0.060 | 0.030 | 0.0100 | 0.0060 | 1.0 | 1.00 |
| Comparative example 16 | 0.435 | 0.440 | 0.060 | 0.060 | 0.0005 | 0.0050 | 0.0 | 5.00 |
| Comparative example 17 | 0.423 | 0.438 | 0.060 | 0.060 | 0.0025 | 0.0050 | 0.0 | 3.00 |
| Comparative example 18 | 0.416 | 0.436 | 0.059 | 0.059 | 0.0050 | 0.0020 | 0.0 | 2.00 |
| Comparative example 19 | 0.426 | 0.431 | 0.059 | 0.059 | 0.0098 | 0.0020 | 0.0 | 0.25 |
| Comparative example 20 | 0.411 | 0.421 | 0.074 | 0.074 | 0.0050 | 0.0040 | 0.0 | 1.00 |
| Comparative example 21 | 0.421 | 0.421 | 0.074 | 0.074 | 0.0050 | 0.0040 | 0.0 | 0.00 |
| Comparative example 22 | 0.411 | 0.421 | 0.074 | 0.074 | 0.0050 | 0.0020 | 0.0 | 1.00 |
| Comparative example 23 | 0.441 | 0.446 | 0.050 | 0.050 | 0.0050 | 0.0010 | 0.0 | 0.50 |
| Comparative example 24 | 0.470 | 0.470 | 0.025 | 0.025 | 0.0050 | 0.0000 | 0.0 | 0.00 |
| Comparative example 25 | 0.414 | 0.419 | 0.057 | 0.057 | 0.0238 | 0.0050 | 0.0 | 0.10 |

The relative density, the average grain diameter, and the resistivity of the piezoelectric ceramics produced in the examples 1 to 22 and the comparative examples 1 to 25 are shown in Table 2.

Figure 6A:
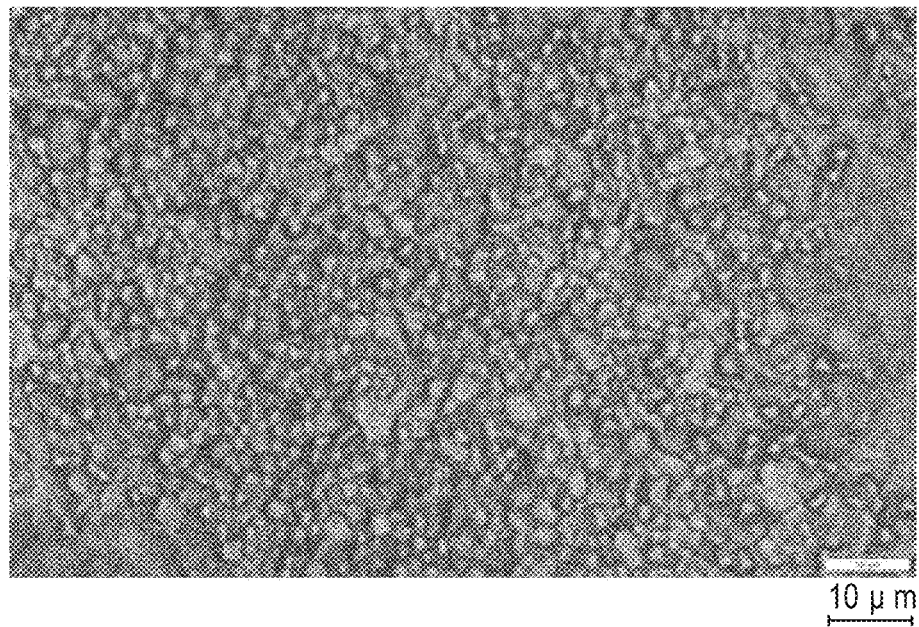
FIG. 6A is a diagram showing an optical microscopic image of a surface of a piezoelectric material (sintered body), which is an example of the present invention.
Figure 6B:
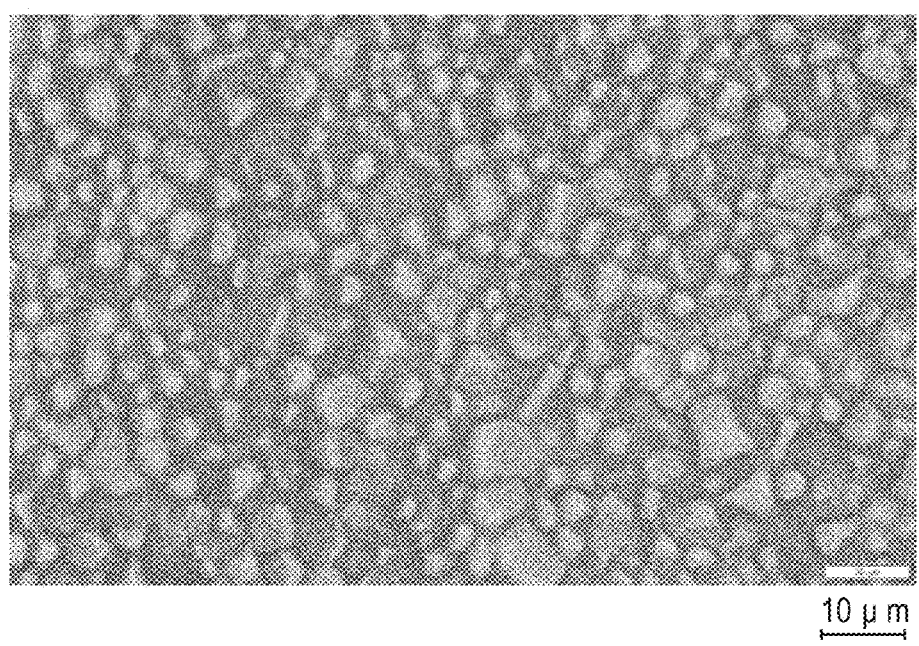
FIG. 6B is a diagram showing an optical microscopic image of a surface of a piezoelectric material (sintered body) as a comparative example.

Additionally, FIGS. 6A and 6B show examples of images from the observation of the surface of the sintered body by the optical microscope. FIG. 6A is an image showing a surface of the piezoelectric ceramics produced in the example 1, and FIG. 6B is an image showing a surface of the piezoelectric ceramics produced in the comparative example 7. Based on these images, the values such as the average grain diameter of 2.8 µm of the piezoelectric ceramics in the example 1 and the average grain diameter of 5.4 µm of the piezoelectric ceramics in the comparative example 7 were obtained.

As shown in Table 2, the average grain diameters of the piezoelectric ceramics produced in the examples 1 to 22 were all within the range from 1.0 µm to 4.0 µm. In contrast, the average grain diameters of the piezoelectric ceramics produced in the comparative examples 1 to 6, 14, 15, and 24 were less than 1.0 µm, and the average grain diameters of the piezoelectric ceramics produced in the comparative examples 7 to 13, 16 to 23, and 25 were greater than 4.0 µm.

As shown in Table 2, the densities of the piezoelectric ceramics produced in the examples 1 to 22 were all 95% or more of the theoretical density. In contrast, the densities of the piezoelectric ceramics produced in the comparative examples 1 to 6, 13 to 15, 19, 22, and 25 are smaller than 95% of the theoretical density.

As shown in Table 2, the resistivities during the application of the direct current of 10 V to the piezoelectric ceramics in the examples 1 to 22 were 210 GΩcm or more.

In contrast, the resistivities of the piezoelectric ceramics produced in the comparative examples 1 to 15, 17 to 19, 22, and 25 were less than 200 GΩcm and were small, and this suggested that a sufficient voltage was not applied during the polarization.

TABLE 2

|  | relative density (%) | average grain diameter (µm) | resistivity (GΩcm) |
|---|---|---|---|
| Example 1 | 97 | 2.8 | 270 |
| Example 2 | 98 | 3.5 | 230 |
| Example 3 | 97 | 3.0 | 910 |
| Example 4 | 96 | 2.9 | 1250 |
| Example 5 | 96 | 3.1 | 1110 |
| Example 6 | 97 | 3.2 | 1210 |
| Example 7 | 98 | 3.5 | 430 |
| Example 8 | 96 | 3.3 | 650 |
| Example 9 | 97 | 3.0 | 1230 |
| Example 10 | 95 | 1.6 | 1420 |
| Example 11 | 95 | 2.1 | 940 |
| Example 12 | 95 | 1.6 | 260 |
| Example 13 | 95 | 1.0 | 220 |
| Example 14 | 98 | 4.0 | 1450 |
| Example 15 | 95 | 1.3 | 210 |
| Example 16 | 98 | 3.7 | 680 |
| Example 17 | 97 | 3.3 | 840 |
| Example 18 | 96 | 3.5 | 560 |
| Example 19 | 95 | 3.9 | 210 |
| Example 20 | 97 | 1.5 | 730 |
| Example 21 | 96 | 1.2 | 430 |
| Example 22 | 96 | 3.2 | 550 |
| Comparative example 1 | 94 | 0.9 | 0.5 |
| Comparative example 2 | 92 | 0.8 | 0.8 |

TABLE 2-continued

| | relative density (%) | average grain diameter (μm) | resistivity (GΩcm) |
|---|---|---|---|
| Comparative example 3 | 91 | 0.7 | 0.4 |
| Comparative example 4 | 89 | 0.5 | 0.3 |
| Comparative example 5 | 94 | 0.8 | 0.7 |
| Comparative example 6 | 93 | 0.7 | 0.6 |
| Comparative example 7 | 98 | 5.4 | 50 |
| Comparative example 8 | 99 | 5.5 | 100 |
| Comparative example 9 | 99 | 6.4 | 60 |
| Comparative example 10 | 98 | 5.1 | 70 |
| Comparative example 11 | 96 | 7.4 | 110 |
| Comparative example 12 | 95 | 6.9 | 80 |
| Comparative example 13 | 93 | 4.2 | 10 |
| Comparative example 14 | 91 | 0.7 | 0.7 |
| Comparative example 15 | 93 | 0.9 | 1.2 |
| Comparative example 16 | 95 | 6.9 | 230 |
| Comparative example 17 | 95 | 6.9 | 110 |
| Comparative example 18 | 99 | 5.2 | 95 |
| Comparative example 19 | 94 | 15.8 | 120 |
| Comparative example 20 | 95 | 12.5 | 280 |
| Comparative example 21 | 96 | 10.1 | 330 |
| Comparative example 22 | 94 | 6.8 | 170 |
| Comparative example 23 | 96 | 5.4 | 2000 |
| Comparative example 24 | 95 | 0.5 | 680 |
| Comparative example 25 | 93 | 20.0 | 90 |

B. Evaluation of Piezoelectric Properties

The piezoelectric elements created in the examples 1 to 22 and the comparative examples 1 to 25 were used to evaluate the piezoelectric properties of the piezoelectric ceramics constituting each of the piezoelectric elements. First, the polarization processing was performed on each piezoelectric element to arrange the polarization axes of the evaluation target piezoelectric element in the certain direction. Specifically, the polarization processing was performed by applying a voltage of 7.0 kV for 30 minutes to the piezoelectric element sunk in oil at 150° C. The piezoelectric constant $d_{31}$, the mechanical quality factor $Q_m$, and the dielectric dissipation factor of the piezoelectric ceramics of each piezoelectric element on which the polarization processing was thus-performed were evaluated by the resonance-antiresonance method. Additionally, for the Curie temperature $T_c$, the temperature at which the capacitance becomes the maximum was measured, and the thus-measured temperature was set as the Curie temperature $T_c$.

The measured (evaluated) results of the piezoelectric constant $d_{31}$, the relative permittivity $\varepsilon_r$, the mechanical quality factor $Q_m$, a dielectric loss, and the Curie temperature $T_c$ of the piezoelectric ceramics of the piezoelectric elements created in the examples 1 to 22 and the comparative examples 1 to 25 are shown in Table 3.

For the piezoelectric constant $d_{31}$, in the examples 1 to 22, 68 pm/V in the example 16 was the minimum, and the others were greater. In contrast, in the comparative examples 1 to 25, 60 pm/V in the comparative examples 18, 19 was the maximum, and the others were smaller. Because many of them had the low resistivities shown in Table 2, it can be considered that a part of the voltage applied during the polarization was leaked, and it was impossible to exert the piezoelectric performance due to the insufficient voltage application to the piezoelectric element.

For the relative permittivity $\varepsilon_r$, in the examples 1 to 22, 1190 in the example 14 was the smallest, and the others were greater. As can be seen from the values of the relative densities and the grain diameters shown in Table 2, it can be considered that the piezoelectric ceramics produced in the examples 1 to 22 could obtain the great permittivity because the target theoretical densities were satisfied while achieving the small grain diameters. In contrast, it is considered that the comparative examples 1 to 25, specifically the comparative examples 8 to 12 and 16 to 25 obtained the small permittivity because the relative densities were small or the grain diameters were coarsened.

Figure 7A:
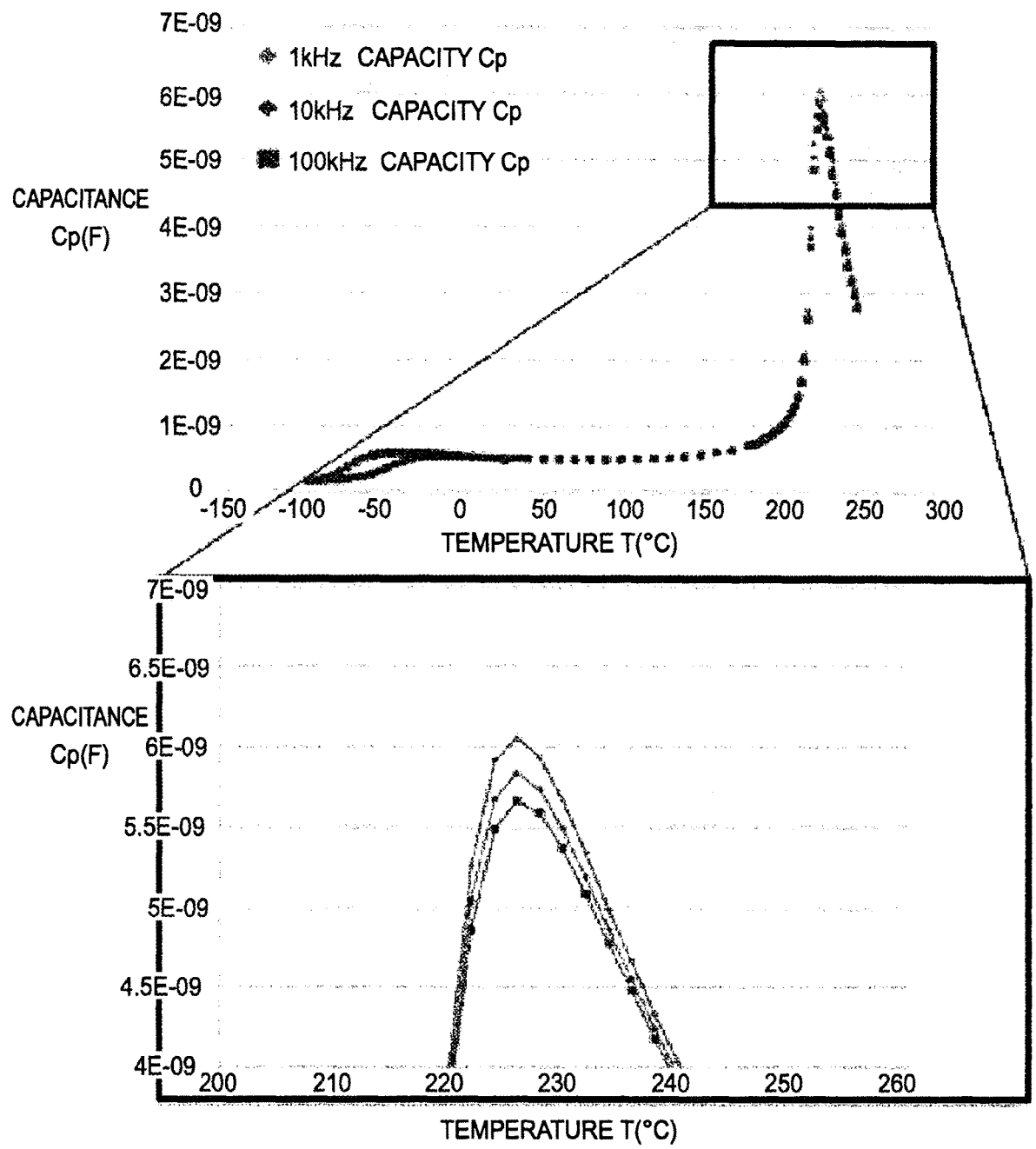
FIG. 7A is a diagram showing a frequency dependence of a temperature variation of capacitance of the piezoelectric element of the comparative example.
Figure 7B:
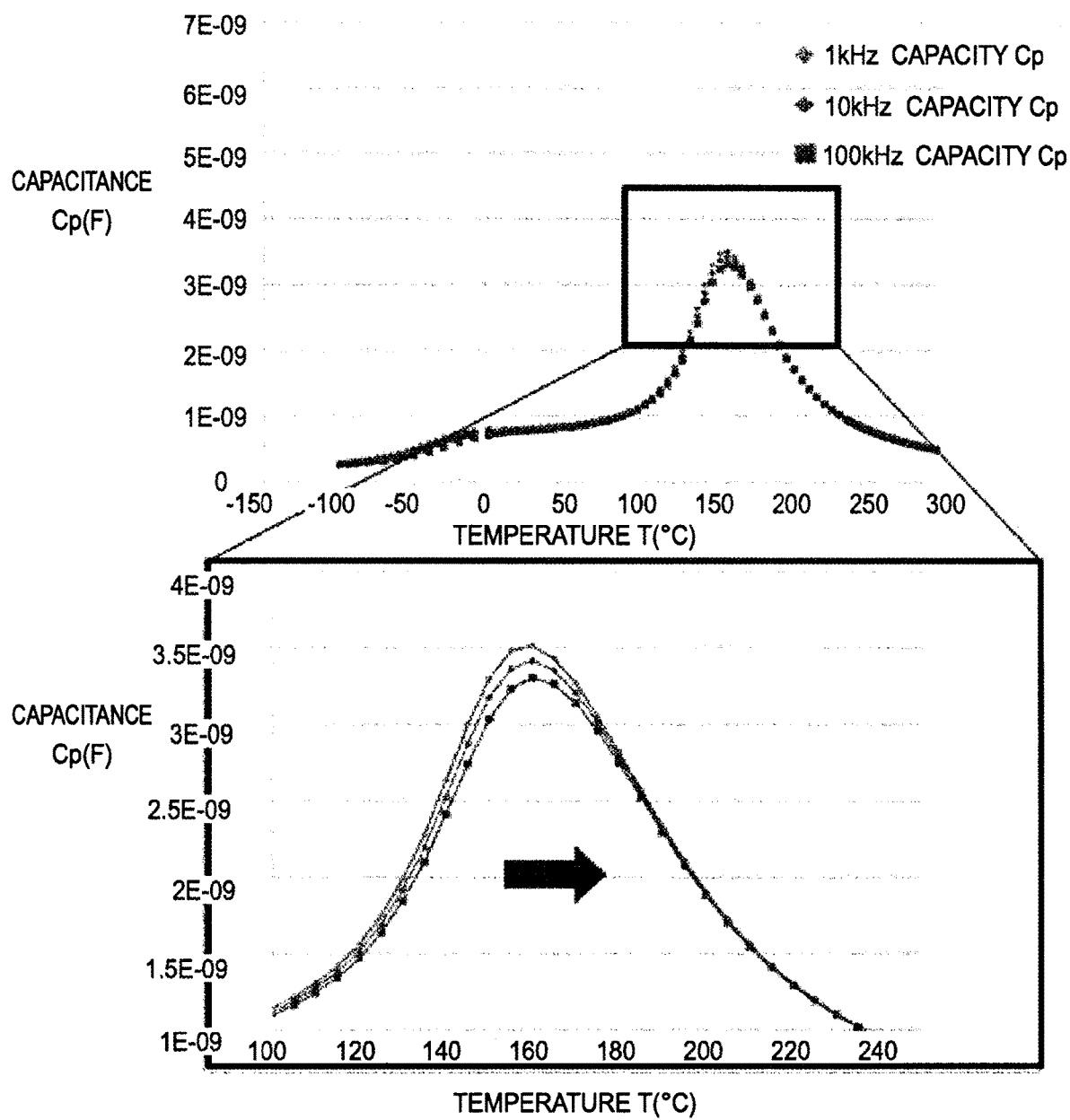
FIG. 7B is a diagram showing a frequency dependence of a temperature variation of capacitance of the piezoelectric element of the example of the present invention.

These effects are reflected in the temperatures and the frequency dependences of the capacitance shown in FIGS. 7A and 7B. FIG. 7A is a graph of the comparative example 8, and it can be seen that the temperature at which the capacitance becomes the maximum (that is, the Curie temperature) was not changed even when the measurement frequency was changed to 1 kHz, 10 kHz, and 100 kHz. In contrast, in the example 1 in FIG. 7B, the Curie temperature $T_c$ was shifted to the high temperature side as the measurement frequency was increased to 1 kHz, 10 kHz, and 100 kHz. This phenomenon shows the characteristics of the relaxor effect of the piezoelectric body, and it can be considered that the piezoelectric properties of this example was improved by the relaxor effect as well.

For the mechanical quality factor $Q_m$, 310 in the examples 2, 14, and 17 was the maximum, and the others were smaller values. In the comparative examples, some of the piezoelectric elements having a great grain diameter shown in Table 2 indicated a value of the mechanical quality factor $Q_m$ of greater than 500.

In the comparative examples 16 to 25 where a value of c–d obtained based on the relative numbers c and d of Ba and Ti is 2.7 times smaller than the relative number e of Mg, the mechanical quality factor $Q_m$ was 500 or greater and was great, but the piezoelectric constant $d_{31}$ of 60 pm/V in the comparative examples 18 and 19 was the maximum, and the others were smaller. Since it is known in general that the mechanical quality factor $Q_m$ and the piezoelectric constant $d_{31}$ have a trade-off relationship, it can be said that the examples could improve the piezoelectric constant $d_{31}$ by sacrificing the mechanical quality factor $Q_m$. Although it has been able to purposely increase the mechanical quality factor $Q_m$, it has been unable to purposely increase the piezoelectric constant $d_{31}$. The examples purposely increase the piezoelectric constant $d_{31}$ using this trade-off relationship.

In the examples 1 to 22, for the Curie temperature $T_c$, 113° C. in the example 19 was the lowest value, and the Curie temperatures $T_c$ in other examples were equal to or higher with one of them being 270° C. in the example 11. In contrast, in the comparative examples 1 to 25, the Curie temperature $T_c$ in the comparative example 13 where the a-value and the c-value were great was 93° C., which was lower than 100° C., and it is expected that the temperature restriction on the usage temperature, the implementation temperature, and the like is tightened when the piezoelectric element is used as an electronic device.

TABLE 3

| | d31 (pm/V) | relative permittivity (-) | Qm (-) | dielectric loss (%) | Tc (° C.) |
|---|---|---|---|---|---|
| Example 1 | 98 | 2200 | 210 | 1.4 | 160 |
| Example 2 | 73 | 1440 | 310 | 1.2 | 185 |
| Example 3 | 90 | 1630 | 205 | 1 | 215 |
| Example 4 | 95 | 1710 | 180 | 1.1 | 204 |
| Example 5 | 86 | 1610 | 213 | 0.9 | 212 |
| Example 6 | 85 | 1640 | 218 | 0.9 | 200 |
| Example 7 | 80 | 1270 | 280 | 1.3 | 230 |
| Example 8 | 86 | 1670 | 211 | 1.2 | 225 |
| Example 9 | 90 | 1680 | 185 | 1.5 | 201 |
| Example 10 | 94 | 1630 | 190 | 1.3 | 193 |

TABLE 3-continued

| | d31 (pm/V) | relative permittivity (−) | Qm (−) | dielectric loss (%) | Tc (° C.) |
|---|---|---|---|---|---|
| Example 11 | 70 | 1410 | 206 | 1.2 | 270 |
| Example 12 | 83 | 1490 | 199 | 1.1 | 255 |
| Example 13 | 90 | 1550 | 175 | 1.5 | 233 |
| Example 14 | 70 | 1190 | 310 | 1.3 | 190 |
| Example 15 | 101 | 1810 | 213 | 1.6 | 153 |
| Example 16 | 68 | 1490 | 240 | 1.4 | 150 |
| Example 17 | 72 | 1350 | 310 | 1.2 | 145 |
| Example 18 | 82 | 1930 | 200 | 1.4 | 120 |
| Example 19 | 96 | 2050 | 241 | 1.1 | 113 |
| Example 20 | 90 | 1690 | 198 | 1.9 | 172 |
| Example 21 | 83 | 1510 | 196 | 1.9 | 230 |
| Example 22 | 84 | 2330 | 202 | 1.6 | 110 |
| Comparative example 1 | 52 | 2310 | 130 | 2.4 | 106 |
| Comparative example 2 | 56 | 1960 | 130 | 2.2 | 146 |
| Comparative example 3 | 55 | 1810 | 150 | 3.4 | 186 |
| Comparative example 4 | 50 | 1700 | 100 | 3.8 | 226 |
| Comparative example 5 | 41 | 1330 | 216 | 2.8 | 275 |
| Comparative example 6 | 42 | 1150 | 175 | 2.6 | 290 |
| Comparative example 7 | 45 | 1130 | 220 | 1.2 | 283 |
| Comparative example 8 | 56 | 1060 | 360 | 0.6 | 218 |
| Comparative example 9 | 55 | 1010 | 310 | 0.9 | 195 |
| Comparative example 10 | 58 | 920 | 390 | 0.7 | 155 |
| Comparative example 11 | 53 | 910 | 415 | 1.1 | 130 |
| Comparative example 12 | 56 | 1040 | 340 | 1.3 | 115 |
| Comparative example 13 | 58 | 1460 | 224 | 2.6 | 93 |
| Comparative example 14 | 53 | 2100 | 110 | 2.4 | 142 |
| Comparative example 15 | 56 | 1860 | 170 | 1.8 | 151 |
| Comparative example 16 | 55 | 940 | 500 | 1.1 | 160 |
| Comparative example 17 | 56 | 930 | 570 | 1.3 | 161 |
| Comparative example 18 | 60 | 1050 | 560 | 0.8 | 174 |
| Comparative example 19 | 60 | 920 | 550 | 0.9 | 162 |
| Comparative example 20 | 55 | 960 | 570 | 1.0 | 173 |
| Comparative example 21 | 54 | 970 | 570 | 0.6 | 192 |
| Comparative example 22 | 57 | 980 | 530 | 1.2 | 164 |
| Comparative example 23 | 59 | 1020 | 530 | 0.8 | 186 |
| Comparative example 24 | 54 | 940 | 520 | 0.9 | 196 |
| Comparative example 25 | 51 | 1010 | 560 | 1.2 | 195 |

C. Creation of Stacked Piezoelectric Element

Example 23

The stacked-type piezoelectric element of the present invention was created according to the following steps.

A PVB binder was added to the powder calcinated at 900° C. before the spray drying granulating in the example 1 and mixed, and thereafter a sheet was formed by the doctor blade method to obtain a green sheet having a thickness of 50 μm.

A conductive paste for the internal electrodes was printed on the above-described green sheet. A paste of Ag 70%-Pd 30% alloy (Ag/Pd=2.33) was used as the conductive paste. Nine sheets of the green sheets to which the conductive paste was applied were stacked, and the stacked body was sintered at 1200° C. for five hours to obtain the sintered body. After the above-described sintered body was cut into the size of 10 mm×2.5 mm, the side surfaces of the cut sintered body were polished, a pair of external electrodes (first electrode and second electrode) short-circuiting the internal electrodes alternately are formed by the Au sputtering, and thus the stacked piezoelectric element as shown in FIG. 2B was created.

It was found that the internal electrodes made of Ag—Pd and the piezoelectric material layers were formed alternately by observing the cross section of the thus-obtained stacked piezoelectric element.

The polarization processing was performed on the stacked piezoelectric element. Specifically, the sample was heated up to 150° C. in an oil bath, a voltage of 7 kV/mm was applied between the first electrode and the second electrode for 30 minutes, and the sample was cooled down to the room temperature while maintaining the voltage application.

As a result of evaluating the piezoelectric properties of the thus-obtained stacked piezoelectric element, the sufficient insulation properties were achieved, and the piezoelectric constant, the Curie temperature, and the dielectric dissipation factor similar to that of the piezoelectric material of the example 1 could be obtained.

D. Creation of Electronic Equipment Using Piezoelectric Element

Example 24

The liquid ejection head shown in FIG. 3A was created by using the piezoelectric elements of the example 1 and the example 23. The ejection of ink following the inputted electric signal was confirmed.

This liquid ejection head was used to create the liquid ejection apparatus shown in FIG. 3B. It was confirmed that the ink was ejected on the recording medium in response to the inputted electric signal.

Example 25

The oscillatory wave motor shown in FIG. 4A or FIG. 4B was created by using the piezoelectric elements of the example 1 and the example 23. The rotation of the motor in response to the application of the alternating-current voltage was confirmed.

This oscillatory wave motor was used to create the optical equipment shown in FIGS. 4C to 4E. The autofocusing operation in response to the application of the alternating-current voltage was confirmed.

Example 26

The dust removing apparatus shown in FIGS. 5A and 5B was created by using the piezoelectric elements of the example 1 and the example 23. An excellent dust removal efficiency was confirmed by dispersing plastic beads and applying the alternating-current voltage.

This dust removing apparatus was used to create the image pickup apparatus shown in FIGS. 5C and 5D. With this image pickup apparatus electrically conducted and operated, the image pickup apparatus removed well the dust on the surface of the image pickup unit, and an image with no dust defection could be obtained.

According to the present invention, it is possible to provide a novel lead-free piezoelectric material indicating excellent piezoelectric properties by implementing perovskite-type metal oxide containing Na, Nb, Ba, Ti, and Mg in which the relative number of the atoms satisfies the relational expression (1). Additionally, the present invention can provide a high-performance piezoelectric element and electronic equipment using the lead-free piezoelectric material.

The piezoelectric material of the present invention achieves small loads on the environment with no lead used and also has outstanding moisture resistance and storage stability because no potassium is used.

The piezoelectric material of the present invention develops the excellent piezoelectric properties. Additionally, since the piezoelectric material of the present invention contains no lead, the loads on the environment are reduced. For this reason, the piezoelectric material of the present invention can be used with no problem for equipment using many piezoelectric materials such as the liquid ejection head, the oscillatory wave motor, and the dust removing apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A piezoelectric material, comprising:
   perovskite-type metal oxide containing Na, Nb, Ba, Ti, and Mg, wherein
   relative numbers a, b, c, d, and e in a ratio of numbers of Na, Nb, Ba, Ti, and Mg atoms contained in the piezoelectric material satisfy a following relational expression (1), $0.430 \le a \le 0.460, 0.433 \le b \le 0.479, 0.040 \le c \le 0.070, 0.0125 \le d \le 0.0650, 0.0015 \le e \le 0.0092, 0.9 \times 3e \le c-d \le 1.1 \times 3e, a+b+c+d+e=1$ (1), where a denotes the relative number of Na atoms, b denotes the relative number of Nb atoms, c denotes the relative number of Ba atoms, d denotes the relative number of Ti atoms, and e denotes the relative number of Mg atoms.

2. The piezoelectric material according to claim 1, wherein
   the relative numbers a, b, and e have a relationship of $0.9 \times 2e \le b-a \le 1.1 \times 2e$.

3. The piezoelectric material according to claim 1, wherein
   the relative numbers a, b, c, d, and e have a relationship of $0.97 \le (a+c)/(b+d+e) \le 1.03$.

4. The piezoelectric material according to claim 1, wherein
   a sum of contents of Pb and K in the piezoelectric material is less than 1000 atom ppm with respect to a sum of contents of Na, Nb, Ba, Ti, and Mg in the piezoelectric material.

5. The piezoelectric material according to claim 1, wherein
   an average grain diameter of crystal grains in the piezoelectric material is 1.0 μm or greater and 4.0 μm or smaller.

6. The piezoelectric material according to claim 1, wherein
   the piezoelectric material contains Mn in an amount of 0.0050 or smaller in an atomic ratio where a sum of the numbers of Na, Nb, Ba, Ti, and Mg atoms is 1.

7. The piezoelectric material according to claim 1, wherein
   the piezoelectric material contains Mn in an amount of 0.0005 or greater and 0.0050 or smaller in an atomic ratio where a sum of the numbers of Na, Nb, Ba, Ti, and Mg atoms is 1.

8. The piezoelectric material according to claim 1, wherein
   a relative density of the piezoelectric material is 92% or greater and 99.9% or smaller.

9. A piezoelectric element, comprising:
   a piezoelectric material portion; and
   an electrode, wherein
   a piezoelectric material constituting the piezoelectric material portion is the piezoelectric material according to claim 1.

10. The piezoelectric element according to claim 9, wherein
    the piezoelectric material portion and the electrode are stacked alternately.

11. A liquid ejection head, at least comprising:
    a liquid chamber including a vibration unit provided with the piezoelectric element according to claim 9; and
    an ejection port communicating with the liquid chamber.

12. A liquid ejection apparatus, comprising:
    a placement portion for an object; and
    the liquid ejection head according to claim 11.

13. An oscillatory wave motor, at least comprising:
    a vibration body provided with the piezoelectric element according to claim 9; and
    a moving body in contact with the vibration body.

14. Optical equipment, comprising:
    a drive unit provided with the oscillatory wave motor according to claim 13.

15. A vibration device, comprising:
    a vibration body in which the piezoelectric element according to claim 9 is provided to a vibration plate.

16. A dust removing apparatus, comprising:
    the vibration device according to claim 15.

17. An image pickup apparatus, at least comprising:
    the dust removing apparatus according to claim 16; and
    an image pickup element unit, wherein
    the vibration plate of the dust removing apparatus is provided on a light receiving surface side of the image pickup element unit.

18. Electronic equipment, comprising:
    the piezoelectric element according to claim 9.

* * * * *